(12) United States Patent
Fukuda et al.

(10) Patent No.: US 7,050,623 B1
(45) Date of Patent: May 23, 2006

(54) METHOD AND APPARATUS FOR COMPONENT RECOGNITION

(75) Inventors: Shozo Fukuda, Yamanashi (JP); Iwao Kanetaka, Kofu (JP); Akira Noudo, Yamanashi (JP); Eiichi Hachiya, Kofu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 722 days.

(21) Appl. No.: 10/129,531

(22) PCT Filed: Nov. 7, 2000

(86) PCT No.: PCT/JP00/07791

§ 371 (c)(1),
(2), (4) Date: May 7, 2002

(87) PCT Pub. No.: WO01/35049

PCT Pub. Date: May 17, 2001

(30) Foreign Application Priority Data

Nov. 8, 1999 (JP) .................................. 11-317389
Oct. 31, 2000 (JP) .............................. 2000-332436

(51) Int. Cl.
*G06K 9/00* (2006.01)

(52) U.S. Cl. ...................... 382/151; 382/145; 382/274; 29/740

(58) Field of Classification Search ................ 382/151, 382/149, 141, 145, 274; 348/223.1, 363, 348/226.1; 29/740
See application file for complete search history.

(56) References Cited

U.S. PATENT DOCUMENTS

| | | | |
|---|---|---|---|
| 5,907,644 A * | 5/1999 | Yokota et al. | 382/312 |
| 6,005,965 A * | 12/1999 | Tsuda et al. | 382/145 |
| 6,040,895 A * | 3/2000 | Haas | 355/70 |
| 6,178,257 B1 * | 1/2001 | Alumot et al. | 382/145 |
| 6,608,921 B1 * | 8/2003 | Inoue et al. | 382/146 |
| 6,788,805 B1 * | 9/2004 | Fukushima et al. | 382/141 |

FOREIGN PATENT DOCUMENTS

| | | |
|---|---|---|
| JP | 8-213587 | 8/1996 |
| JP | 10-56299 | 2/1998 |
| JP | 10-93300 | 4/1998 |
| JP | 10-332331 | 12/1998 |

\* cited by examiner

*Primary Examiner*—Sheela Chawan
(74) *Attorney, Agent, or Firm*—Wenderoth, Lind & Ponack, L.L.P.

(57) ABSTRACT

Adjustment of image pickup conditions through alternative selection of two cameras different in resolution, adjustment of image lightness of a to-be-recognized component based on component information of the component, and performing control allows an image of the component to be picked up by either one of the cameras under the image pickup conditions.

22 Claims, 16 Drawing Sheets

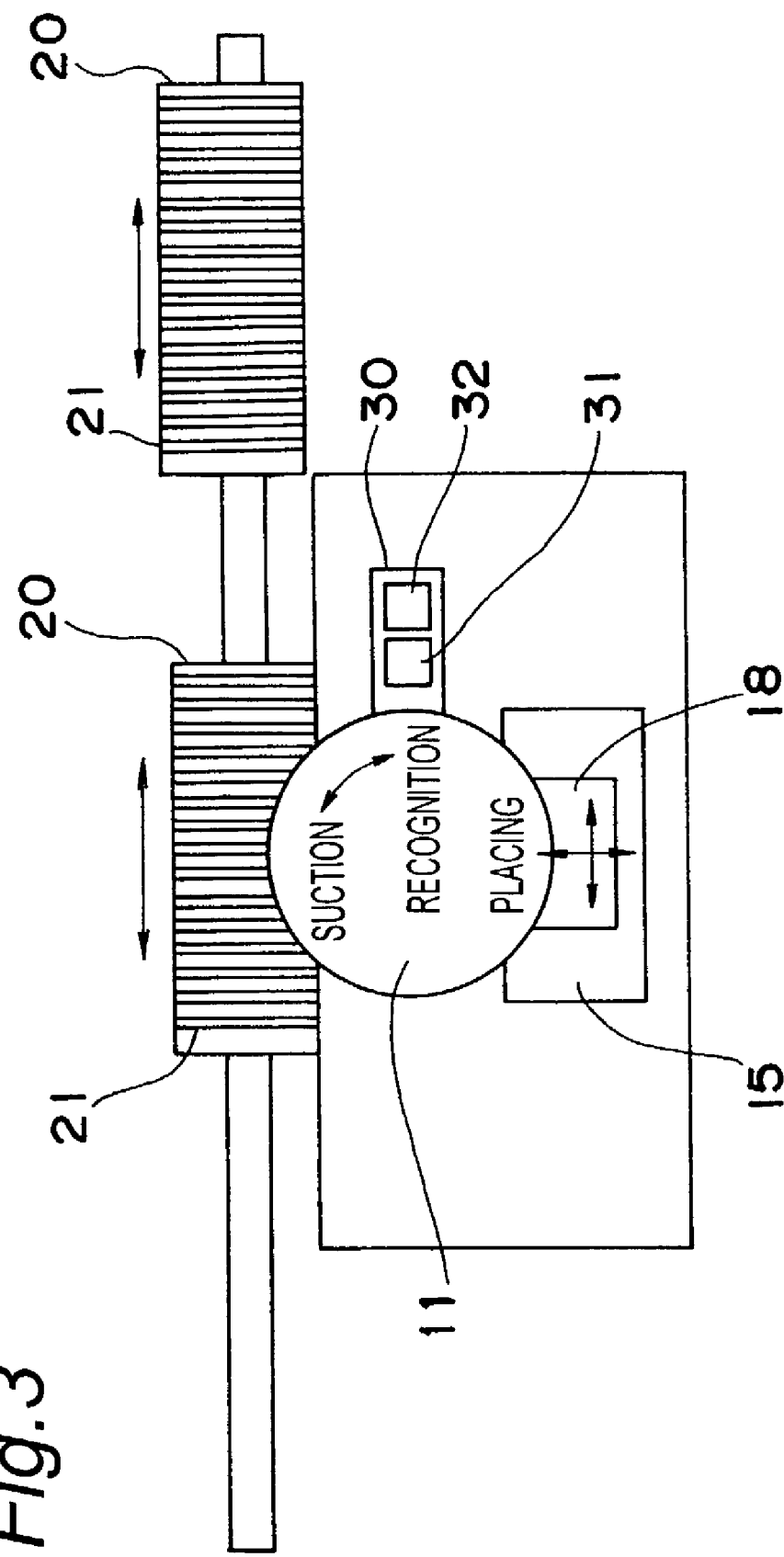

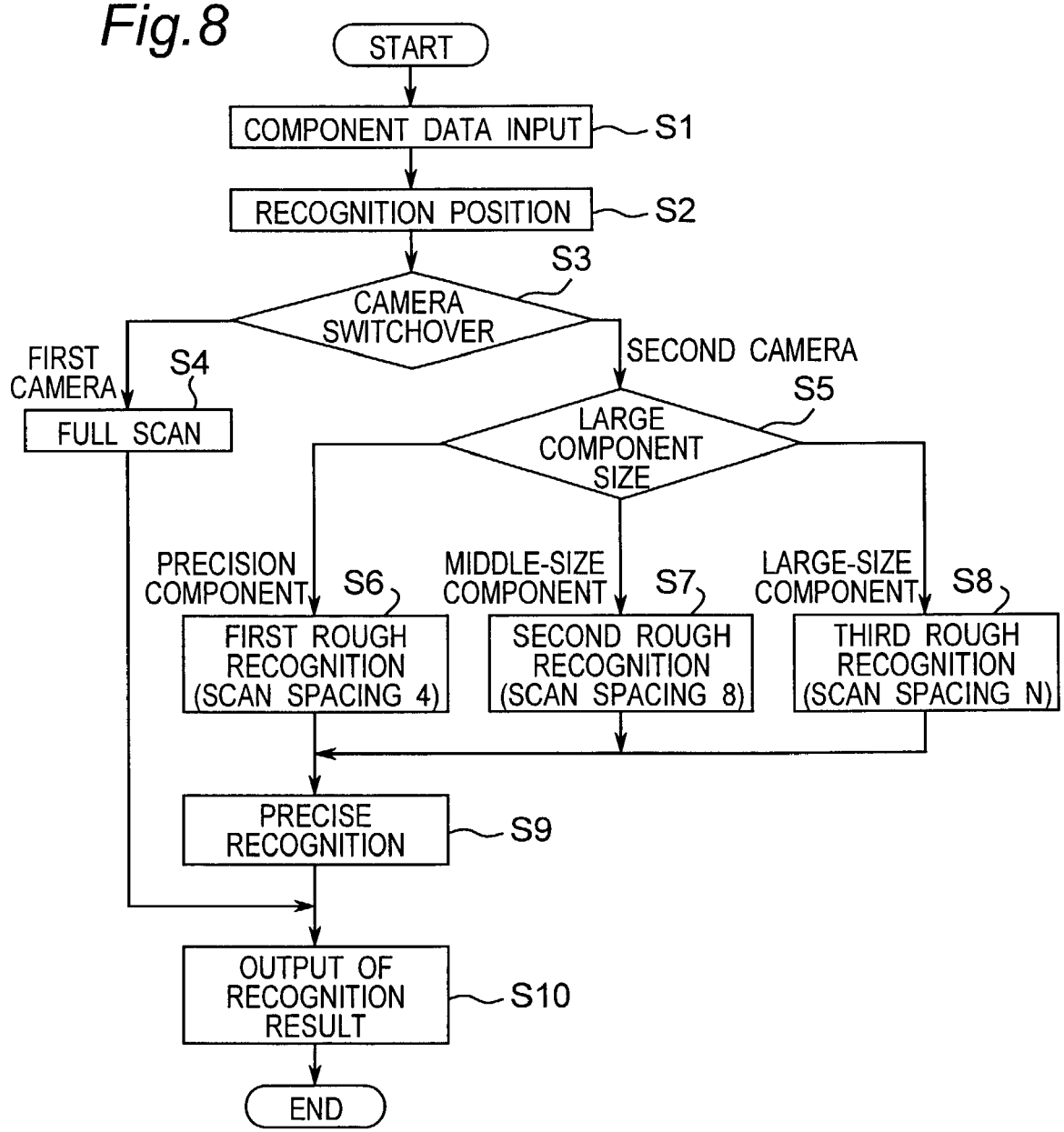

1200 PIXELS
872 LINES
IMAGE DEVICE P
IMAGE OF ELECTRONIC COMPONENT

533 LINES

702 LINES

872 LINES

METHOD AND APPARATUS FOR COMPONENT RECOGNITION

TECHNICAL FIELD

The present invention relates to a component recognition device and a method thereof for image recognition of components, especially electronic components, in a case where the electronic components are recognized as images and placed on circuit forming bodies, as well as to a component mounting apparatus including the component recognition device and a component mounting method including the component recognition method.

BACKGROUND ART

FIG. 11 is a plan view showing a main part of a conventional component mounting apparatus, FIG. 12 is a enlarged cross sectional view showing an image pickup unit of FIG. 11, and FIG. 13 is a schematic timing chart showing operation of each section in response to rotation of a rotary index table shown in FIG. 11. On a periphery of rotary index table 111 (hereinafter referred to as index table 111), suction nozzles 112 are installed.

A component feeding section 120 feeds each of a plurality of electronic component feeding units 121, storing various electronic components, to a lower side of a suction nozzle 112 moved to a suction position in accordance with control instructions. The suction nozzle 112 sucks an electronic component 113 from an electronic component feeding unit 121, and then rotation of the index table 111 moves the suction nozzle 112 to a recognition position (time t1 (FIG. 13)).

Once the suction nozzle 112 sucking and holding the electronic component 113 moves to the recognition position, with a lapse of vibration damping waiting time (time t1 to t2), LEDs 136 and 137 on a component image pickup unit 130 adequately illuminate the electronic component, so that first and second cameras 131 and 132 receive exposure from the electronic component via a mirror 133, a half mirror 134, and a further mirror 135 (time t2 to t3), and a taken image signal of the electronic component 113 is transmitted to an image processing unit based on NTSC method or the like (time t3 to t5). During transmission of the image signal to the image processing unit, the suction nozzle 112 that sucked the electronic component 113 starts to move to a placement position (time t4).

In a super high-speed component mounting apparatus, a series of processing operations including these operations is repeatedly executed in, for example, 80 ms tact. It is noted that the first and second cameras 131 and 132 in this example are both provided with, for example, about 250,000-pixel resolution, and each is equipped with an optical system different in terms of target components such that image pickup of a small component is performed by the first camera 131 while image pickup of a large component is performed by the second camera 132.

As for semiconductor devices, a degree of integration is incremental for implementation of a multifunction and the like, and large-size high-accuracy electronic components are increasing while smaller electronic components are also being manufactured. These circumstances are shown in an electronic component measurement table of FIG. 14. As shown in this table, electronic components include BGA (Ball grid Array) whose side length is about 32 mm, and there are also manufactured unshown larger-sized electronic components. It is noted that in FIG. 14, mini Tr denotes a mini-transistor, tantalum C denotes a tantalum capacitor, chip L denotes a large chip component that is larger than a chip component up to 0.6 to 3.2 mm, power Tr denotes a power transistor, aluminum electrolytic C denotes an aluminum electrolytic capacitor, SOJ refers to Small Outline J Lead Package, PLCC refers to Plastic Leaded Chip Carrier, SOP refers to Small Outline Package, CSP (0.5 p to 0.8 p) refers to Chip Sized Package having interelectrode pitches of 0.5 to 0.8 mm, and BGA (0.1 p–) refers to Ball Grid Array having interelectrode pitches of at least 0.1 mm. The numeral 0603 denotes a chip component having a size of 0.6 mm×0.3 mm, the numeral 2125 denotes a chip component having a size of 2.1 mm×2.5 mm, the numeral 3216 denotes a chip component having a size of 3.2 mm×1.6 mm, the □18 denotes a square chip component having a side length of 18 mm, and the □32 denotes a square chip component having a side length of 32 mm.

According to the conventional component mounting apparatus described with reference to FIGS. 11 and 12, if the first and second cameras 131 and 132 of a same kind having approximately 250,000-pixel resolution are each equipped with optical systems suitable in size for components subjected to image pickup, the first and second cameras 131 and 132 can at best perform good image pickup and image recognition of electronic components within respective ranges L1 and L2 as shown in the conventional method in FIG. 14 (up to a side length of about 18 mm).

This is, for example, because if the optical system mounted on the second camera is changed to enlarge the image pickup range, the small number of pixels thereof disturbs clear recognition of individual terminals (pins and balls) in an electronic component. An example thereof is shown in FIG. 15, wherein although an image EZ0 of an electronic component is obtained by the second camera as an image EZ1, an image of terminals thereof becomes unclear.

It is naturally considerable that as an extension of this conventional technology, a unit number of cameras is increased, for example, to three units, so that a third camera may be used for components having a side length of about at least 18 mm. However, this complicates structure and brings about high costs, and size of the image pickup unit itself becomes large and heavy, thereby causing an issue of susceptibility to influence of mechanical vibration.

Accordingly, for solving the above issue, it is an object of the present invention to provide a component recognition device and a method thereof as well as a component mounting apparatus and a method thereof enabling image pickup of small components to large components of approximately the same image pickup quality while maintaining good resolution for image recognition with use of image pickup units, for example two cameras, and enabling image processing while maintaining high-speed tact.

SUMMARY OF THE INVENTION

In order to accomplish the above object, the present invention has the following constitutions.

According to a first aspect of the present invention, there is provided a component recognition device for recognizing and processing a picked-up image of a component, comprising:

an illumination unit for emitting illumination light to the component when held by a component holding member and to be placed on a circuit forming body;

a first image pickup unit for recognizing this illuminated component;

a second image pickup unit for recognizing the illuminated component with resolution higher than that of the first image pickup unit; and a control section for enabling adjustment of image pickup conditions through alternative selection of the first image pickup unit and the second image pickup unit and through adjustment of image lightness of a component to be recognized, based on component information of this component, and thus controlling such that an image of the component is picked up by either one of the image pickup units under the image pickup conditions.

According to a second aspect of the present invention, there is provided a component recognition device as defined in the first aspect, wherein the illumination unit is provided with plural kinds of illumination sources capable of illuminating the component with different kinds of illumination light, and being different in terms of their disposed position relative to a component, and wherein the control section adjusts the image pickup conditions through adjustment of an illuminance of illumination from the illumination unit to the component, through selection of kinds or positions of plural kinds of the illumination sources or selection of the kinds and the positions of plural kinds of the illumination sources, or through adjustment of an illuminance of illumination from the illumination unit to the component and selection of kinds or positions of plural kinds of the illumination sources or selection of kinds and positions of plural kinds of the illumination sources, based on component information of the component, and thus controls such that an image of the component is picked up by one of the image pickup units.

According to a third aspect of the present invention, there is provided a component recognition device as defined in the first or second aspect, wherein the control section adjusts the image pickup conditions through adjustment of an exposure time of a corresponding one of the image pickup units based on the component information of the component, and thus controls such that an image of the component is picked up by the corresponding one of the image pickup units.

According to a fourth aspect of the present invention, there is provided a component recognition device as defined in any one of the first to third aspects, wherein the control section adjusts the image pickup conditions through adjustment of image signal gain so as to be suited for image recognition based on the component information of the component to eliminate difference in lightness of the image to be picked up due to difference in performance between the first image pickup unit and the second image pickup unit and kind of the component, and thus controls such that an image of the component is picked up by a corresponding one of the image pickup units.

According to a fifth aspect of the present invention, there is provided a component recognition device as defined in any one of the first to fourth aspects, wherein the control section adjusts the image pickup conditions through adjustment of a readout clock frequency of the second image pickup unit to be higher than a readout clock frequency of the first image pickup unit if the second image pickup unit is selected based on the component information of the component, and thus controls such that an image of the component is picked up by a corresponding one of the image pickup units.

According to a sixth aspect of the present invention, there is provided a component recognition device as defined in any one of the first to fifth aspects, wherein the control section adjusts the image pickup conditions through setting of a scan spacing of a component image picked up by one of the image pickup units in accordance with this image pickup unit and kind of the component based on the component information of the component, and thus controls such that an image of the component is picked up by this image pickup unit, with the component recognition device further comprising an image recognition processing section for scanning a picked-up component image based on the scan spacing of the component image set by the control section in accordance with the image pickup unit and kind of the component, recognizing a component existing region in the component image, and then performing image recognition in a recognized component existing region as an image so as to enable posture recognition of the component.

According to a seventh aspect of the present invention, there is provided a component recognition device as defined in any one of the first to sixth aspects, wherein the illumination unit has an illumination source for emitting illumination light for illuminating the component, whose illumination direction is other than a direction orthogonal to any side of the component.

According to an eighth aspect of the present invention, there is provided a component recognition device as defined in any one of the first to seventh aspects, wherein the illumination unit is composed of a light diffusing plate disposed opposite to the image pickup units relative to the component and above the component when held by the component holding member, an illumination source for emitting illumination light for illuminating the component downwardly, and a reflection section for reflecting illumination light emitted from the illumination source upwardly toward the light diffusing plate, with the illumination light emitted from the illumination source being reflected by the reflection section upwardly toward the light diffusing plate, the illumination light being diffused by the light diffusing plate, and an outline image of the component being picked up by either one of the image pickup units with the diffused light.

According to a ninth aspect of the present invention, there is provided a component recognition device as defined in any one of the first to eighth aspects, wherein the control section selects the second image pickup unit if, in component information of a component, the component is a lead component, or a C4 component of a BAG or a CSP, and selects the first image pickup unit if the component is a chip component based on the component information of the component.

According to a tenth aspect of the present invention, there is provided a component recognition device as defined in the third aspect, wherein the control section prolongs an exposure time if, in the component information of the component, an electrode of the component has difficulty in reflecting light based on the component information of the component.

According to an eleventh aspect of the present invention, there is provided a component recognition device as defined in the second aspect, wherein plural kinds of illumination sources of the illumination unit, different in terms of their disposed position, are composed of an illumination source disposed so as to be able to emit illumination light for illuminating the component from almost right under the component, and an illumination source disposed so as to be able to emit illumination light for illuminating the component from an inclined lower side of the component, and wherein the control section controls the illumination light from the illumination source so as to be emitted from almost right under the component if an electrode of the component is in a mirror state based on the component information of the component.

According to a twelfth aspect of the present invention, there is provided a component recognition method comprising:

adjusting image pickup conditions, based on component information of a component held by a component holding member and to be placed on a circuit forming body, through alternative selection of a first image pickup unit and a second image pickup unit having resolution higher than that of the first image pickup unit, and through adjustment of image lightness of the component to be recognized by either one of the image pickup units;

illuminating the component with illumination units under the image pickup conditions;

picking up an image of the illuminated component with one of the image pickup units under the image pickup conditions; and performing component recognition based on the picked-up image.

According to a thirteenth aspect of the present invention, there is provided a component recognition method as defined in the twelfth aspect, wherein when the image pickup conditions are adjusted, an illuminance of illumination from the illumination unit to the component is adjusted, or kinds or positions of plural kinds of illumination sources are selected or the kinds and the positions of plural kinds of the illumination sources are selected, or an illuminance of illumination from the illumination unit to the component is adjusted and kinds or positions of plural kinds of the illumination sources are selected or the kinds and the positions of plural kinds of the illumination sources are selected based on the component information of the component.

According to a fourteenth aspect of the present invention, there is provided a component recognition method as defined in the twelfth or thirteenth aspect, wherein when the image pickup conditions are adjusted, an exposure time of one image pickup unit is adjusted based on the component information of the component.

According to a fifteenth aspect of the present invention, there is provided a component recognition method as defined in any one of the twelfth to fourteenth aspects, wherein when the image pickup conditions are adjusted, image signal gain is adjusted so as to be suited for image recognition based on the component information of the component to eliminate difference in lightness of the image to be picked up due to difference in performance between the first image pickup unit and the second image pickup unit and kind of the component.

According to a sixteenth aspect of the present invention, there is provided a component recognition method as defined in any one of the twelfth to fifteenth aspects, wherein when the image pickup conditions are adjusted, a readout clock frequency of the second image pickup unit is adjusted to be higher than a readout clock frequency of the first image pickup unit if the second image pickup unit is selected based on the component information of the component.

According to a seventeenth aspect of the present invention, there is provided a component recognition method as defined in any one of the twelfth to sixteenth aspects, wherein when the image pickup conditions are adjusted, a scan spacing of a component image picked up by the image pickup unit is set in accordance with the one image pickup unit and kind of the component based on the component information of the component, and when component recognition is performed based on the picked-up image, the picked-up component image is scanned based on a scan spacing of the component image set in accordance with the one image pickup unit and kind of the component, a component existing region in the component image is recognized, and then image recognition is performed in the recognized component existing region so as to enable posture recognition of the component.

According to an eighteenth aspect of the present invention, there is provided a component recognition method as defined in any one of the twelfth to seventeenth aspects, wherein when the component is illuminated with the illumination unit under the image pickup conditions, illumination direction of illumination light emitted to the component is other than a direction orthogonal to any side of the component.

According to a nineteenth aspect of the present invention, there is provided a component recognition method as defined in any one of the twelfth to eighteenth aspects, wherein when the component is illuminated with the illumination unit under the image pickup conditions, illumination light emitted from an illumination source is reflected by a reflection section upwardly toward a light diffusing plate disposed opposite to the image pickup unit relative to the component, and the illumination light is diffused by the light diffusing plate, and when an image of the illuminated component is picked up by either one of the image pickup units under the image pickup conditions, an outline image of the component is picked up with light diffused by the light diffusing plate.

According to a twentieth aspect of the present invention, there is provided a component recognition method as defined in any one of the twelfth to nineteenth aspects, wherein when the image pickup conditions are adjusted, the second image pickup unit is selected if, in the component information of the component, the component is a lead component, or a C4 component of a BAG or a CSP, while the first image pickup unit is selected if the component is a chip component.

According to a twenty-first aspect of the present invention, there is provided a component recognition method as defined in the fourteenth aspect, wherein when the image pickup conditions are adjusted, an exposure time is prolonged if, in the component information of the component, an electrode of the component has difficulty in reflecting light.

According to a twenty-second aspect of the present invention, there is provided a component recognition method as defined in the thirteenth aspect, wherein when the image pickup conditions are adjusted, the illumination light from the illumination source is controlled so as to be emitted from almost right under the component if an electrode of the component is in a mirror state.

According to a twenty-third aspect of the present invention, there is provided a component mounting apparatus comprising:

the component recognition device as defined in any one of the first to eleventh aspects; and a component holding member for holding the component at a component holding position and moving the component along a moving route to a placement position of a circuit forming body through a recognition position, with the component mounting apparatus illuminating the component when held by the component holding member with the illumination unit of the component recognition device at the recognition position on the moving route to perform recognition processing of the image of the component picked up by the image pickup unit, and correcting a posture of the component holding member relative to the placement position based on a result of recognition processing.

According to a twenty-fourth aspect of the present invention, there is provided a component mounting method with the component holding member provided for holding the component at a component holding position and moving the component along a moving route to a placement position of the circuit forming body through a recognition position, comprising:

illuminating the component held by the component holding member with the illumination unit of the component recognition device at the recognition position on the moving route to perform recognition processing of the component image picked up by the image pickup unit in the component recognition method as defined in any one of the twelfth to twenty-second aspects;

then correcting a posture of the component holding member relative to the placement position based on a result of the recognition processing; and placing the component held by the component holding member on the placement position of the circuit forming body.

BRIEF DESCRIPTION OF DRAWINGS

These and other aspects and features of the present invention will become clear from the following description taken in conjunction with the preferred embodiments thereof with reference to the accompanying drawings, in which:

FIG. 3 is a view showing a rotary index table portion in the electronic component mounting mechanism of FIG. 2 seen from above;

FIG. 8 is a flow chart showing a camera selection and recognition operation based on information on image pickup conditions read from a memory unit by a control unit in a camera interface unit of FIG. 6;

DETAILED DESCRIPTION OF THE PREFERRED EMBODIMENTS

Figure 1:
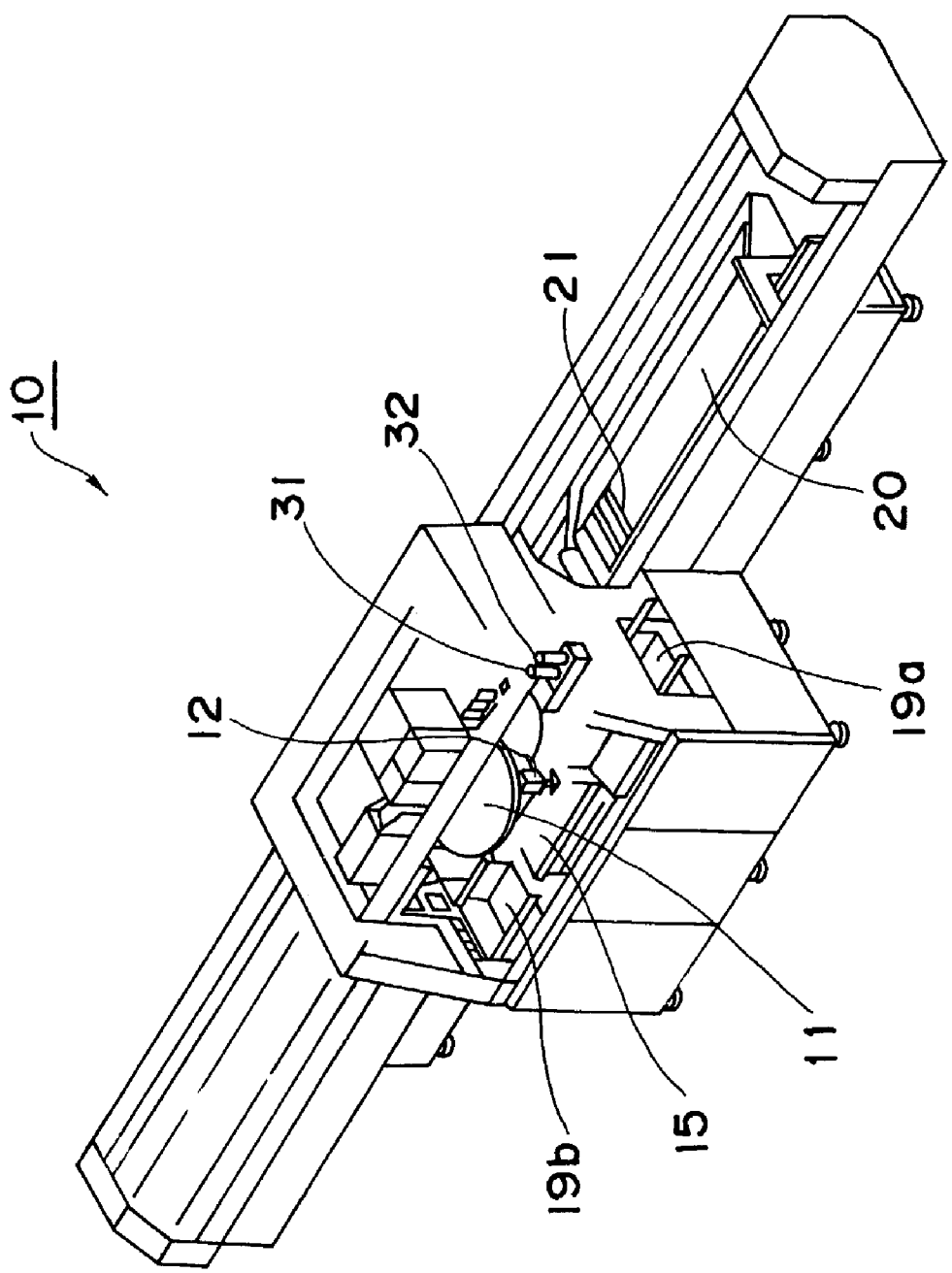
FIG. 1 is a perspective view showing an appearance of an electronic component mounting apparatus having a component recognition device according to one embodiment of the present invention.

Before description of the present invention proceeds, it is to be noted that like parts are designated by like reference numerals throughout the accompanying drawings.

A first embodiment of the present invention will be described hereinafter in detail with reference to drawings.

Embodiments of the present invention will be described hereinafter in detail with reference to drawings.

Figure 2:
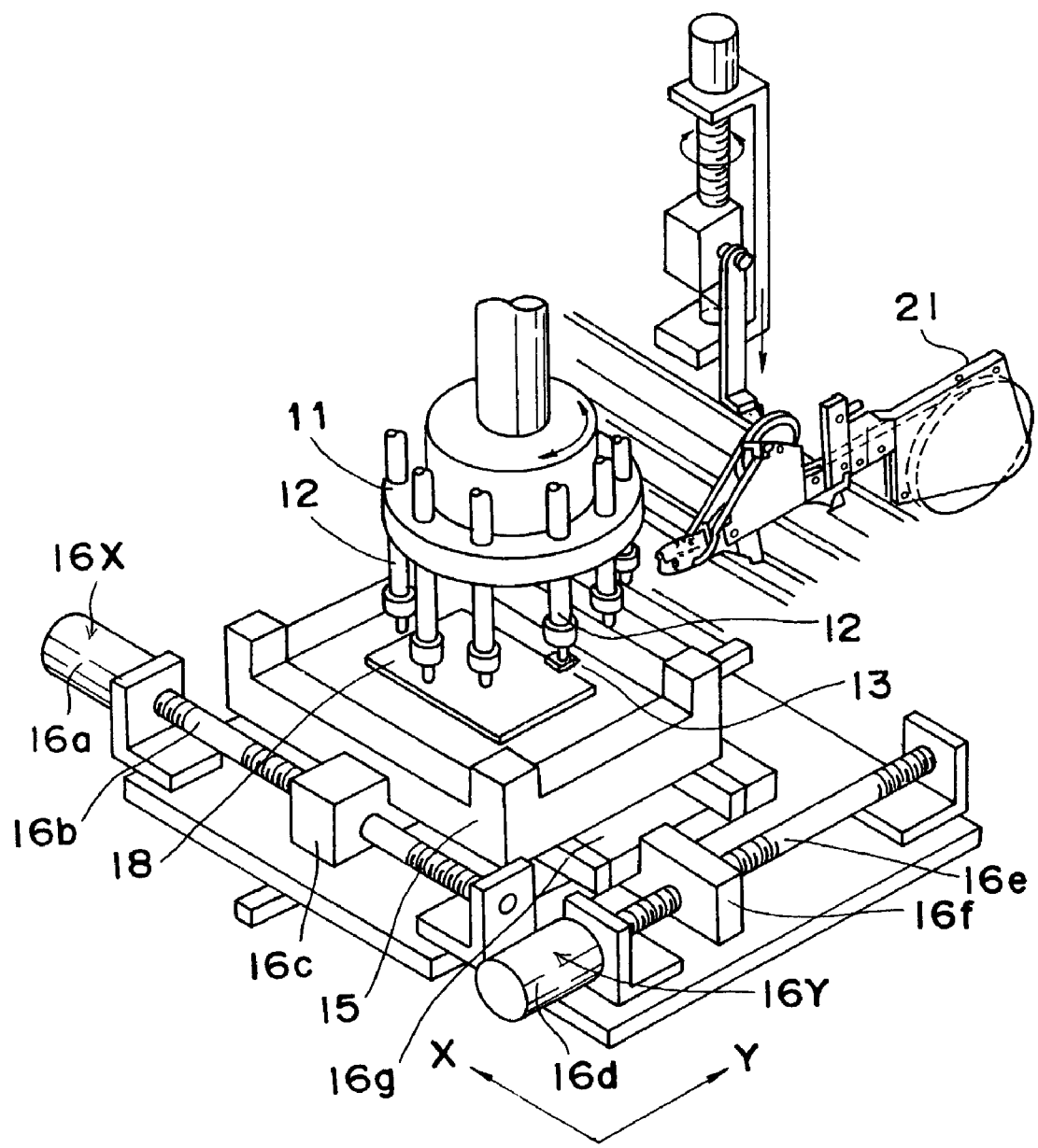
FIG. 2 is a view showing an electronic component mounting mechanism in a central portion of the electronic component mounting apparatus of FIG. 1.
Figure 4A:
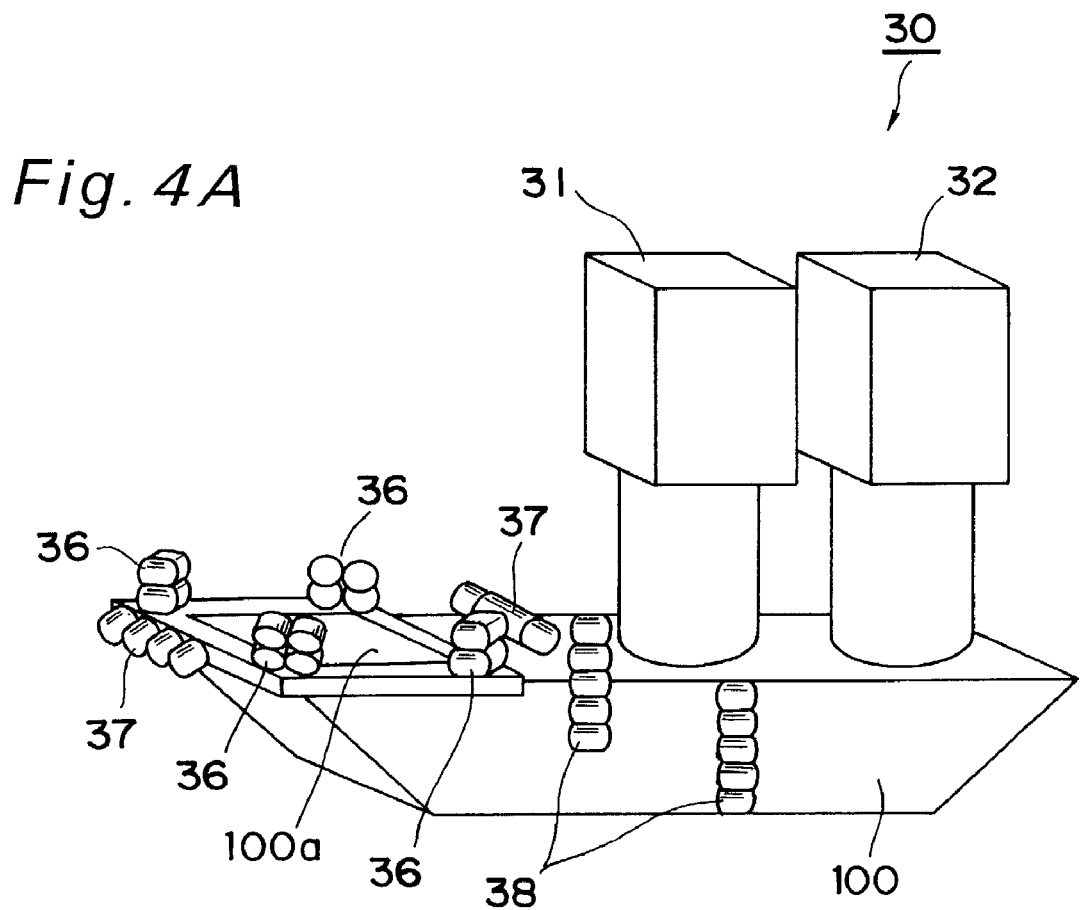
FIGS. 4A and 4B are an external view and a schematic plan view each showing a component recognition device of FIG. 3 and a layout of green LEDs of the component recognition device in relationship with component.
Figure 4B:
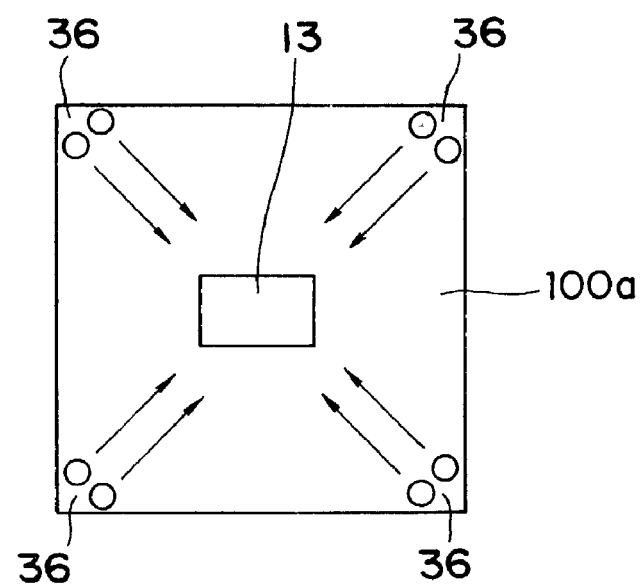
Figure 5:
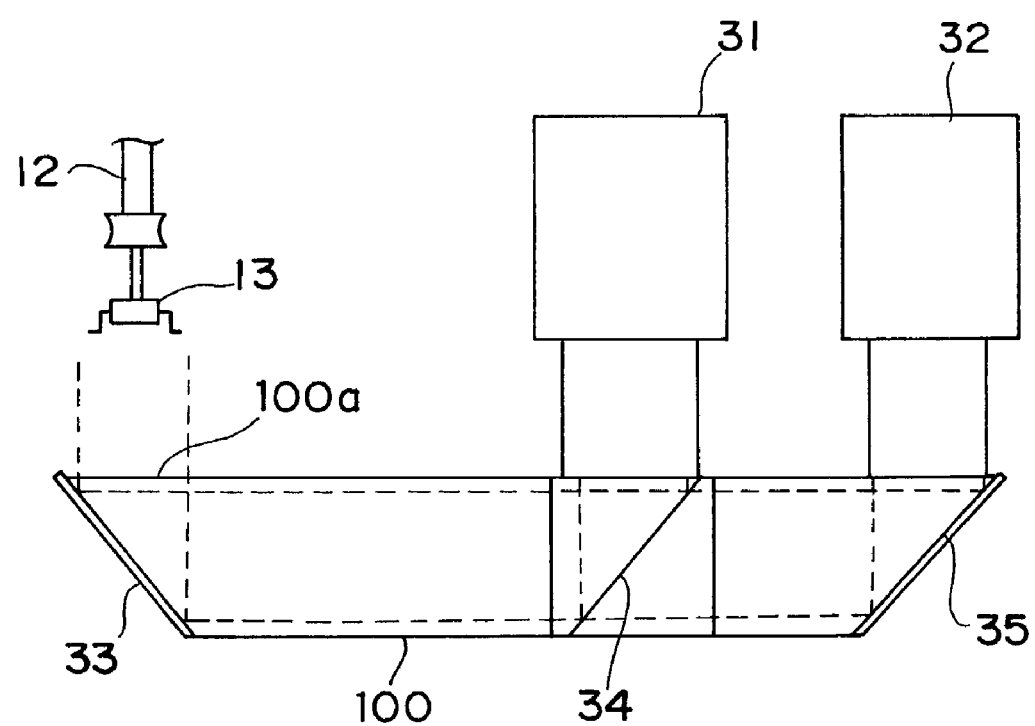
FIG. 5 is a cross sectional view showing structure of the component recognition device of FIG. 4A.
Figure 6:
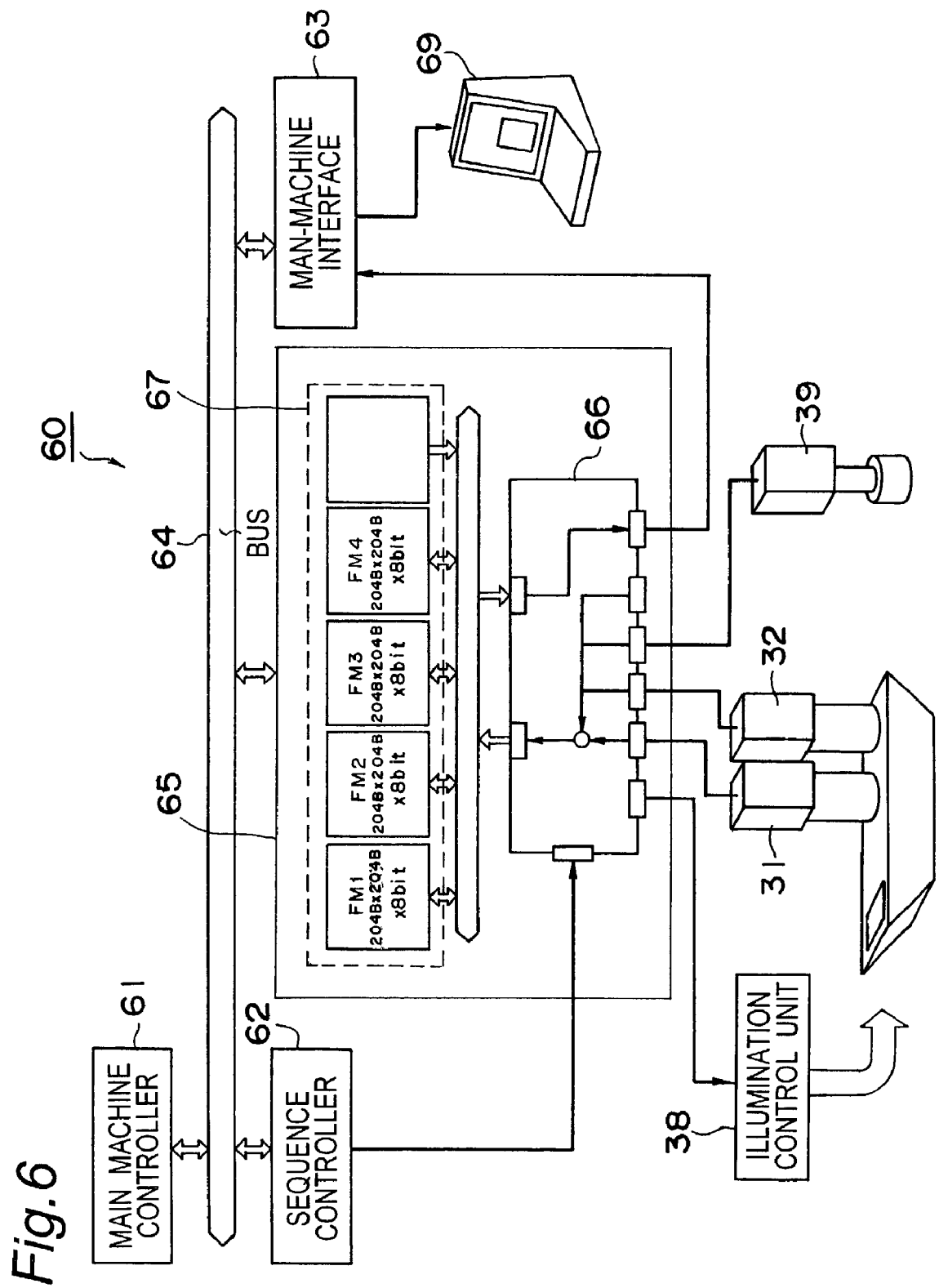
FIG. 6 is a block diagram showing a relationship of each section relating to image processing that performs image processing such as the component recognition device of the electronic component mounting apparatus of FIG. 1.

FIG. 1 is a perspective view showing an appearance of an electronic component mounting apparatus having a component recognition device according to one embodiment of the present invention, FIG. 2 is a view showing an electronic component mounting mechanism in a central portion of the electronic component mounting apparatus of FIG. 1, FIG. 3 is a view showing a rotary index table portion in the electronic component mounting mechanism of FIG. 2 seen from above, FIGS. 4A and 4B are an external view and a schematic plan view each showing a component recognition device of FIG. 3 and a layout of green LEDs of the component recognition device, FIG. 5 is a cross sectional view showing structure of the component recognition device of FIG. 4A, and FIG. 6 is a block diagram showing relationships of each section relating to image processing that performs image processing such as the component recognition device of the electronic component mounting apparatus of FIG. 1. In the electronic component mounting apparatus, an electronic component as an example of a component is subjected to component recognition in a state of being sucked and held by a suction nozzle 12 as an example of a component holding member, and then is placed on a board that is an example of a circuit forming body on which a circuit is formed. The circuit forming body refers to an object on which a circuit is formed including circuit boards such as resin boards, paper-phenol boards, ceramic boards, glass epoxy boards, and film substrates; circuit boards such as single layer boards and monolayer boards; components; cases; frames; and the like. Also, an image pickup unit is, more particularly, made up of a first image pickup unit and a second image pickup unit, and in the present embodiment there are used a first camera 31 as an example of the first image pickup unit and a second camera 32 as an example of the second image pickup unit.

Figure 7:
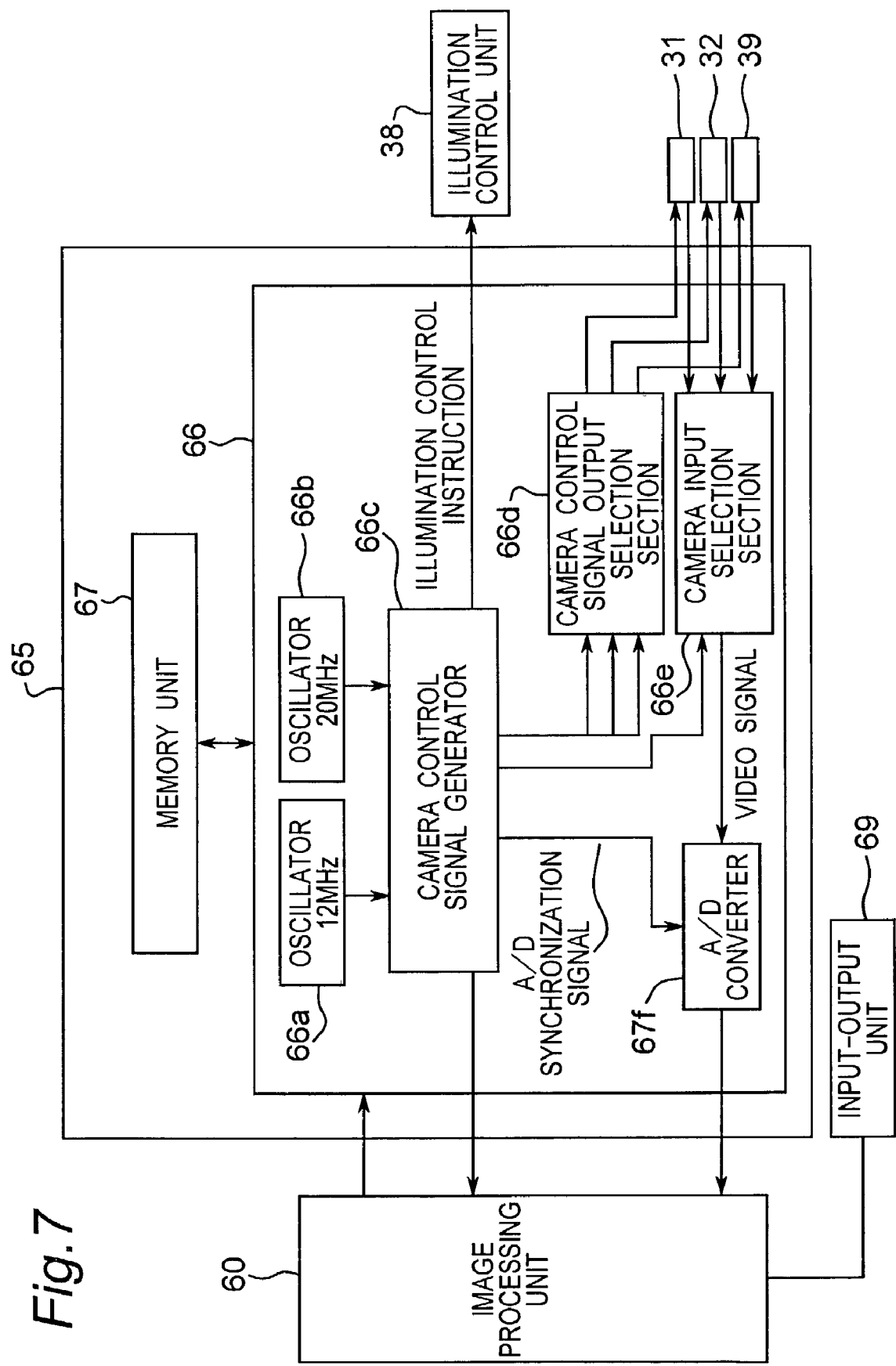
FIG. 7 is a block diagram showing a camera control unit of FIG. 6 in detail.
Figure 9A:
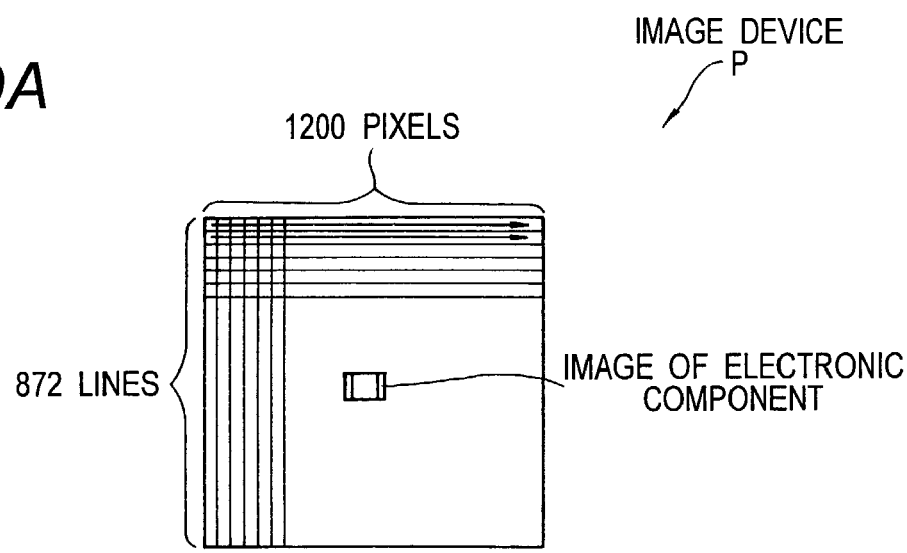
FIG. 9A, FIG. 9B, FIG. 9C, and FIG. 9D are schematic views each showing one example of shortening time for posture recognition of an electronic component.
Figure 9B:
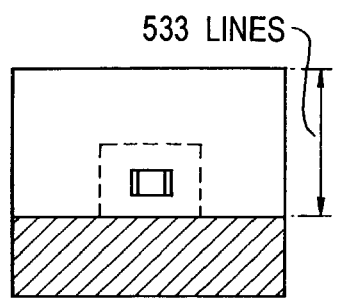
Figure 9C:
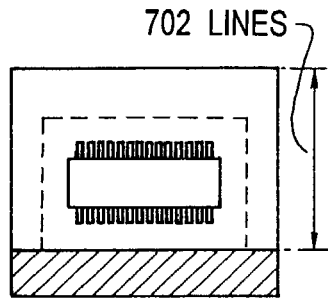
Figure 9D:
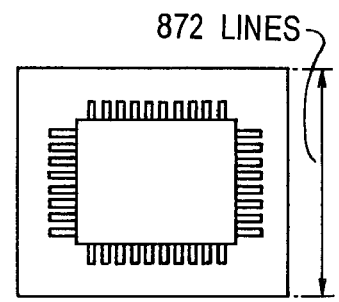
Figure 10:
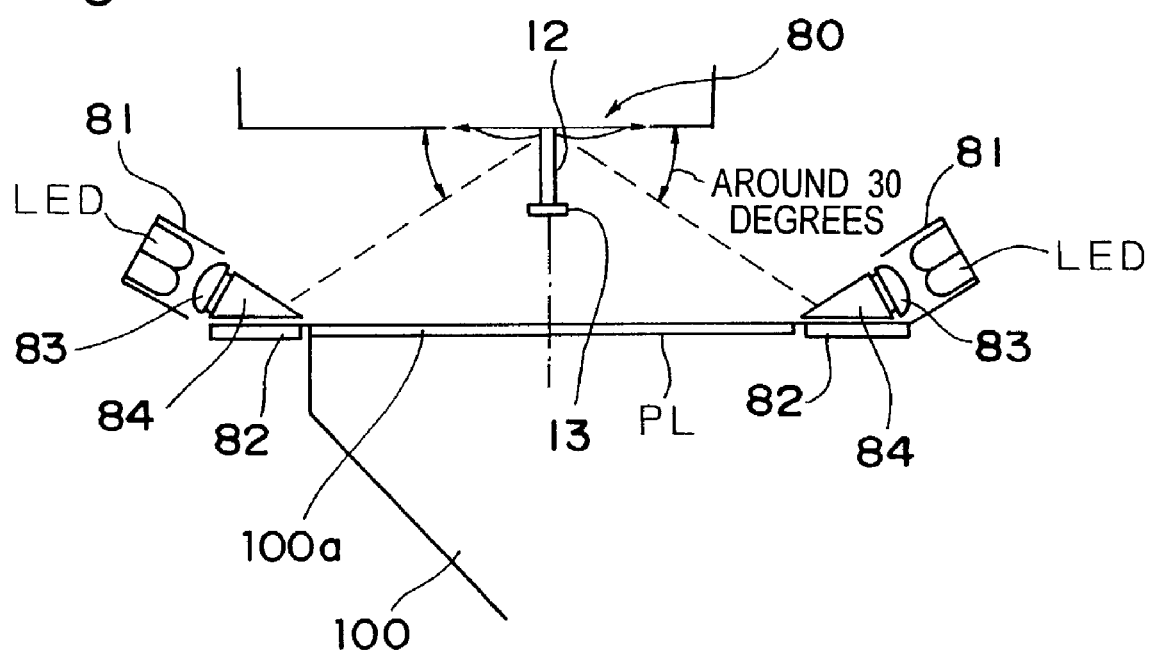
FIG. 10 is a cross sectional view showing structure of an illumination unit disposed right under an index table at a placement position.
Figure 11:
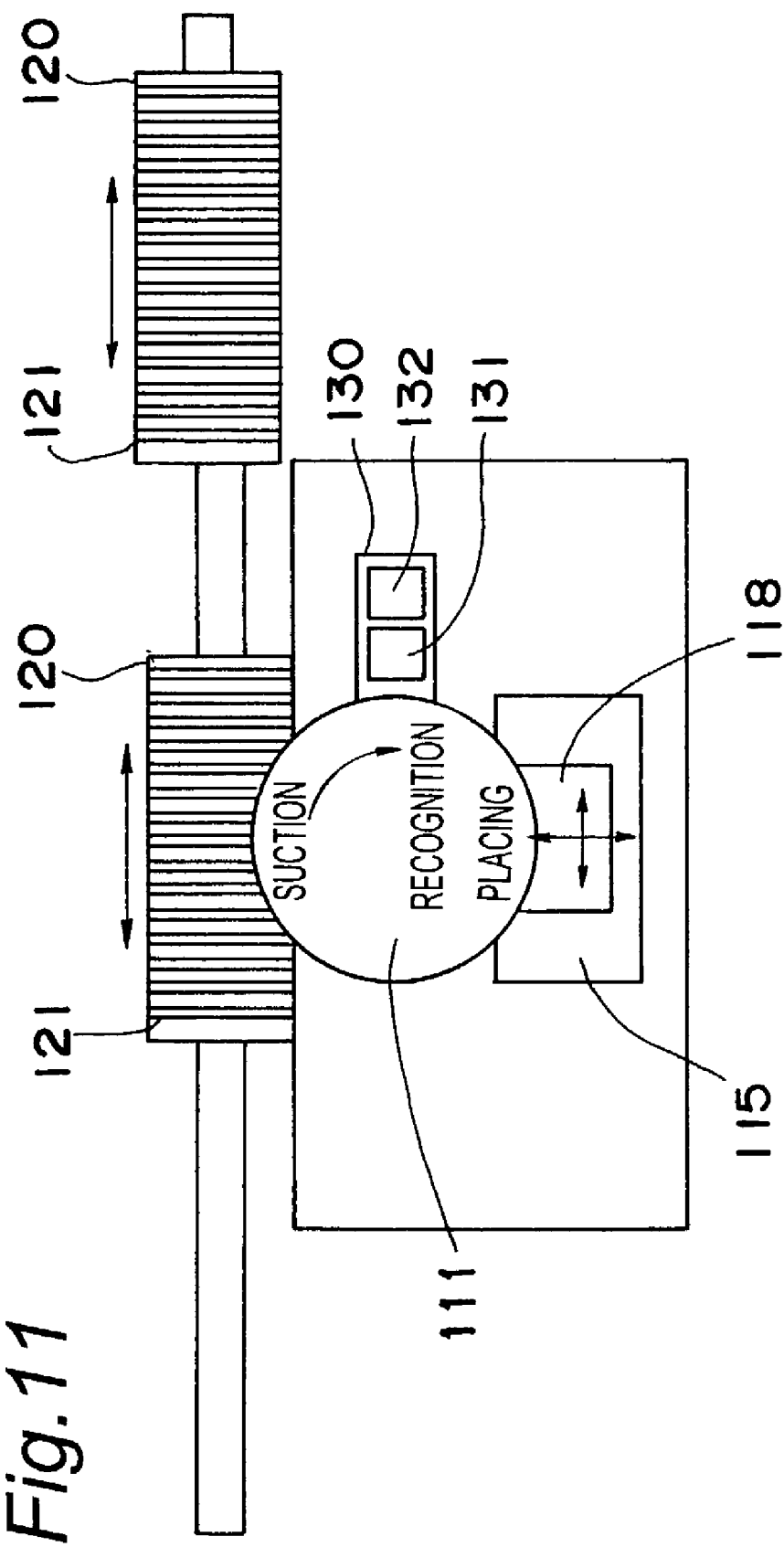
FIG. 11 is a view showing a conventional example of an electronic component mounting mechanism disposed in a central portion of an electronic component mounting apparatus.
Figure 12:
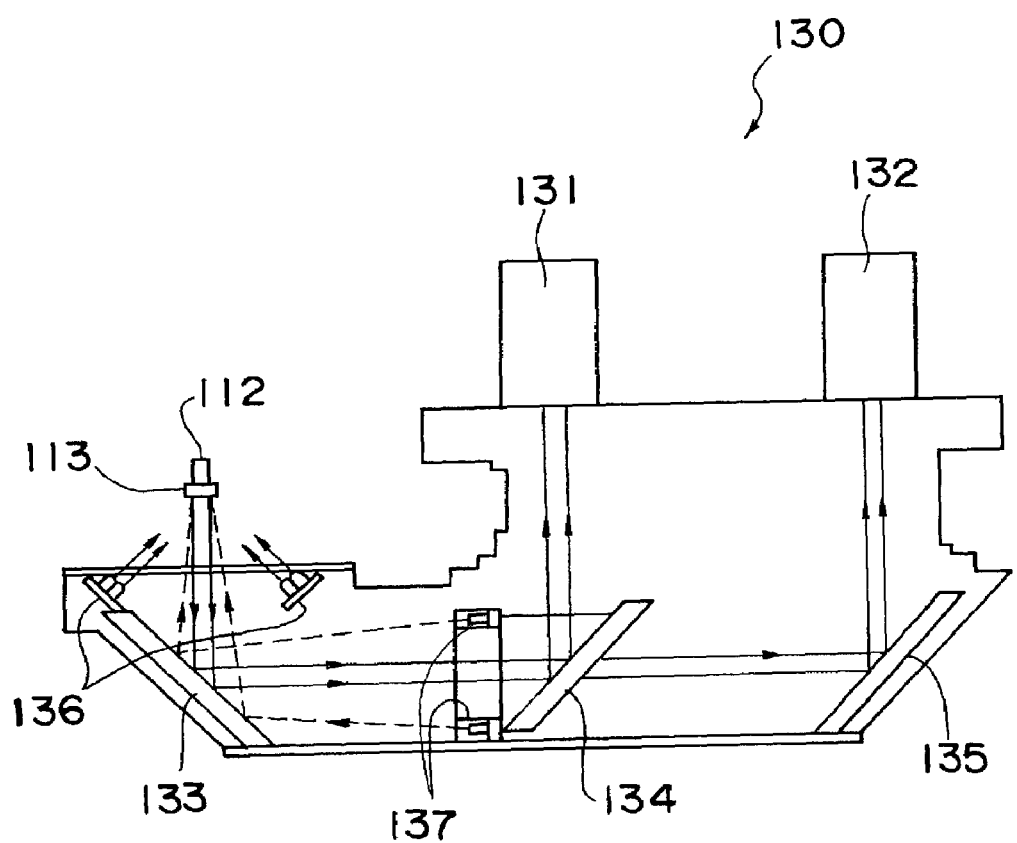
FIG. 12 is a cross sectional view showing structure of an electronic component posture recognition device of the electronic component mounting mechanism of FIG. 11.
Figure 13:
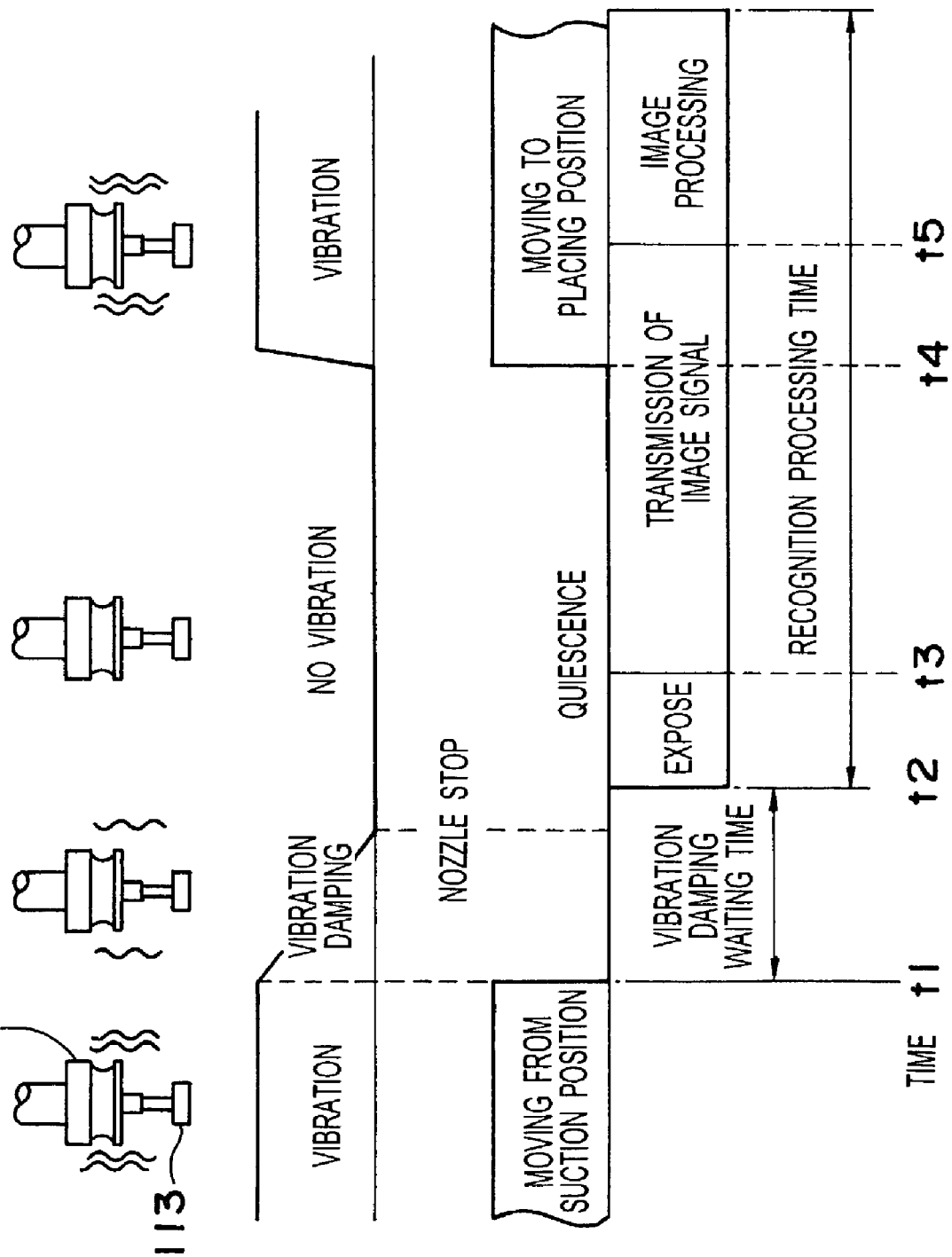
FIG. 13 is a schematic timing chart showing a flow of operation of each section in response to rotation of a rotary index table shown in FIG. 11.
Figure 14:
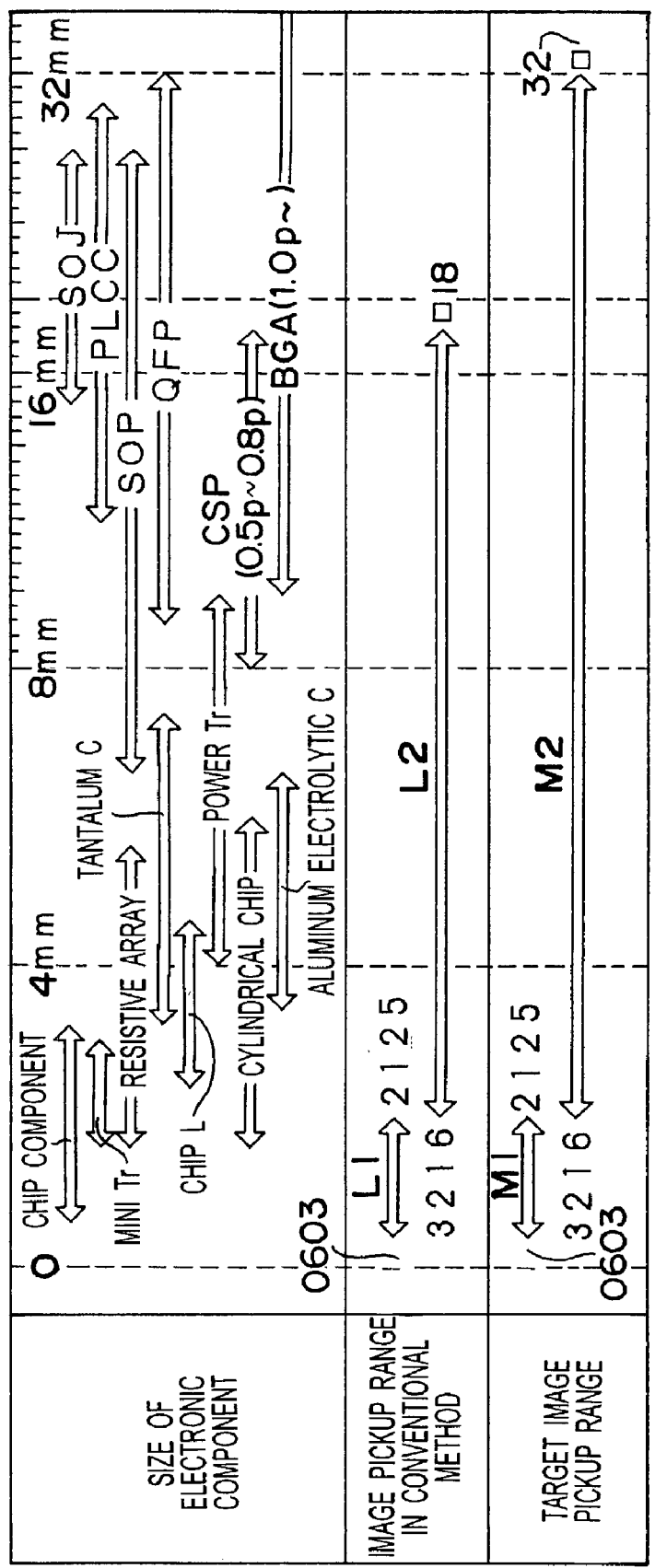
FIG. 14 is a view showing size ranges of respective kinds of electronic components.

FIG. 7 is a block diagram showing a camera control unit of FIG. 6 in detail, FIG. 8 is a flow chart describing operation of a control unit of a camera interface unit of FIG. 6 for selecting either the first camera or the second camera based on information on image pickup conditions read from a memory unit and recognizing a posture of an electronic component sucked by a suction nozzle, FIGS. 9A to 9D are explanatory views showing a method of shortening time for the control unit of FIG. 7 to perform posture recognition of an electronic component according to instructions from the image processing unit, and FIG. 10 is a cross sectional view showing structure for illumination to a light diffusing plate 80.

The component recognition device in the above embodiment is composed of illumination units 36, 37, 38 for emitting illumination light to a component 13 held by a suction nozzle 12 and to be placed on a circuit board 18, the first camera 31 for recognizing illuminated component 13, the second camera 32 for recognizing the illuminated component 13 with resolution higher than that of the first camera 31, and a control section 66 for enabling adjustment of image pickup conditions per an image pickup operation or per a plurality of image pickup operations or with arbitrary timing, through alternative selection of the first camera 31 and the second camera 32 and through adjustment of image lightness of the component 13 to be recognized based on component information of the component 13, and controlling such that an image of the component 13 is picked up by either one of the cameras under the image pickup conditions, and performs recognition processing of a picked-up image of the component 13. By providing such a component recognition device for the electronic component mounting apparatus, a posture of the suction nozzle 12 relative to a placement position of the circuit board 18 (e.g. an angle of rotation about an elevating shaft of the suction nozzle 12) is corrected based on a result of recognition processing performed by the component recognition device, and then, the component 13 held by the suction nozzle 12 is placed on the placement position of the circuit board 18.

Examples of component information of the component 13 include: component characteristic information such as size, height, and kind of the component 13, and whether or not electrodes thereof are mirror finished surfaces; adjustment information based on the component characteristic information such as adjustment information on how to adjust lightness of an image of the component; adjustment information on illuminance of illumination from the illumination unit to the component; selection information on kinds and positions of plural kinds of illumination sources (such as whether or not illumination direction of illumination light emitted to the component is a direction other than a direction orthogonal to any side of the component, whether illumination light emitted to the component is disposed so as to be able to illuminate the component from almost right under the component, and whether illumination light emitted to the component is disposed so as to be able to illuminate the component from an inclined lower side of the component); adjustment information on exposure time of a corresponding image pickup unit; adjustment information on image signal gain suitable for image recognition; information of the illumination unit to be selected based on whether or not the electrodes of the component have difficulty in reflecting light; and information of the illumination unit to be selected based on whether or not the electrodes of the component are in mirror-states. Therefore, the control section 66 obtains component characteristic information of a component 13 to be placed next, obtains adjustment information based on the component characteristic information, and then adjusts image pickup conditions based on the adjustment information.

With reference to FIGS. 1 to 5, description will be first given of structure of an electronic component mounting apparatus 10 having the component recognition device. The electronic component mounting apparatus 10 has an image pickup unit 30 and a circuit portion for controlling the image pickup unit 30 whose structure is largely different from that of a conventional electronic component mounting apparatus. In the central portion of the electronic component mounting apparatus 10, there is disposed a rotary index table 11 (hereinafter referred to as index table 11) having a plurality of suction nozzles 12 installed on a periphery thereof at equal intervals. The index table 11 rotates by a constant angle in response to instructions from the control section 66 (further described later) to move each suction nozzle 12 along a moving route through a suction position exemplifying a component holding position, a recognition position, and a placement position (see FIG. 3), and then again through the suction position, the recognition position, and the placement position in a repeating manner.

A component feeding section 20 installs a plurality of electronic component feeding units 21 (see FIG. 2) in parallel, and moves an electronic component feeding unit 21 accommodating electronic components necessary for a placement operation to the suction position. Once the electronic component feeding unit 21 is placed at the suction position, a suction nozzle 12 sucks an electronic component 13 from the electronic component feeding unit 21.

When the suction nozzle 12 sucks the electronic component 13, the index table 11 rotates to move the suction nozzle 12 to the recognition position. In the recognition position, there is disposed a mechanism section (refer to FIG. 6 and FIG. 7 for the control section 66) of the image pickup unit 30 (see FIG. 3).

The image pickup unit 30 is provided with green LEDs 36, 38 and a red LED 37 for illuminating the electronic component 13 in a position under the suction nozzle 12 stopped in the recognition position, that exemplifies an illumination source of the illumination unit, as well as provided with the first camera 31 and the second camera 32 on a lateral side thereof as shown in FIG. 4A, FIG. 4B, and FIG. 5. Here, the green LED 36, a couple of which is composed of a plurality of green LEDs, more particularly, a total of four LEDs formed by combining two rows of two LEDs disposed in parallel, is provided to a periphery of an opening 100a of a later-described illumination unit case 100 such that an illumination direction of green illumination light from each green LED 36 is not a direction orthogonal to an arbitrary side of an electronic component subjected to image pickup but is, for example, a direction approximately diagonal to the electronic component 13 as shown in FIG. 4B. As for the red LED 37, a couple thereof is composed of, for example, four LEDs disposed in a row, and this couple composed of four LEDs is disposed so as to face each other along a parallel direction of the first camera 31 and the second camera 32 as shown in FIG. 4A. Also, another green LED 38, a couple of which is composed of five LEDs, is disposed in a direction orthogonal to the parallel direction of the first camera 31 and the second camera 32, and parallel to an optical axis direction of the first camera 31 and the second camera 32 so as to face each other with an optical axis for taking a recognition image from the component to the first camera 31 and the second camera 32 (an optical axis for passing light representing an image of the electronic component 13 illuminated by the LEDs 36, 37, 38) interposed therebetween.

It is noted that the green LEDs 36, 38 are used for reflection while the red LED 37 is used for transmission. This is because transmission requires certain quantity of light, and therefore use of the red LED 37 is more preferable than use of the green LEDs 36, 38.

Consequently, the green LEDs 36, 38 are used for picking up an image of light made up of illumination light reflected by the component 13 (in other words, light representing an image of the component 13) with use of either one of the cameras 31 and 32, whereas the red LED 37 is preferably used for picking up an image of only an appearance (in other words, a shadow) of the component 13 with diffused light formed by transmitting LED illumination light to a position higher than the component 13 and extending it to a diffusing plate above the component 13 for diffusion as described later in detail with use of either one of the cameras 31 and 32.

Light (or shadow in other methods) representing an image of the electronic component 13 emitted by these LEDs 36, 37, 38 is, as shown in FIG. 5, reflected by a mirror 33, and one part of this reflected light is reflected by a half mirror 34 (beam splitter) and directed to the first camera 31 while another part of the reflected light passes through the half mirror 34 and is reflected by a mirror 35 and directed to the second camera 32. It is noted that the first camera 31 and the second camera 32 are secured to the illumination unit case 100 in parallel so that each optical axis is in parallel. The mirror 33 is slantingly secured right under the opening 100*a* on one end of the illumination unit case 100 beneath the recognition position of the component 13. The half mirror 34 is slantingly secured in a central portion of the illumination unit case 100 and beneath the first camera 31. The mirror 35 is slantingly secured beneath the second camera 32 on another end of the illumination unit case 100.

In the above-stated example, the first camera 31 is equipped with, for example, a conventional 250,000-pixel image device (e.g. CCD), while the second camera 32 is equipped with, for example, a 1,000,000-pixel image device having resolution higher than the first camera 31. When the image pickup unit 30 having such structure recognizes a posture of the electronic component 13 being sucked by the suction nozzle 12 (a posture herein includes an outline posture, and, where necessary, positions of external terminals (pins and balls)), the index table 11 intermittently rotates to move the suction nozzle 12 to the placement position.

In the placement position, there is disposed an XY table 15 exemplifying a board holding unit which holds the circuit board 18 and a position of which is adjusted relative to the placement position in X and Y directions, for positional adjustment for every mounting operation, by an X-directional drive mechanism 16X and a Y-directional drive mechanism 16Y. On the XY table 15, there is fed a circuit board 18 from a feeding-side board transfer section 19*a* that is a loader composed of, for example, a pair of belt conveyor transfer rails, and this circuit board 18 with all components mounted thereon is delivered to a discharge-side board transfer section 19*b* that is an unloader composed of, for example, a pair of belt conveyor transfer rails. According to a suction state (suction posture) of the electronic component 13, a position of the XY table 15 is adjusted, and the electronic component 13 being sucked by the suction nozzle 12 is placed on the circuit board 18 on the XY table 15. Once placement of the electronic component 13 from the suction nozzle 12 is completed, the index table 11 rotates again and returns emptied suction nozzle 12 to the suction position one by one for repeating a series of operations. In the Y-directional drive mechanism 16Y, forward and reverse rotation of a motor 16*d* reciprocally rotates a ball screw 16*e*. A nut member 16*f* fixed on a Y table 16*g* engages with the ball screw 16*e*, so that forward and reverse rotation of the ball screw 16*e* brings about advance and retreat of the Y table 16*g* along Y direction through the nut member 16*f*. On the Y table 16*g*, there is disposed the X-directional drive mechanism 16X. In the X-directional drive mechanism 16X, forward and reverse rotation of a motor 16*a* reciprocally rotates a ball screw 16*b*. A nut member 16*c* fixed on the XY table 15 engages with the ball screw 16*b*, so that forward and reverse rotation of the ball screw 16*b* brings about advance and retreat of the XY table 15 along X direction through the nut member 16*c*. Therefore, the XY table 15 is advanced and retreated in Y direction by the Y-directional drive mechanism 16Y, and also moved forward and backward in X direction by the X-directional drive mechanism 16X.

As shown in FIG. 6 and FIG. 7, an image processing unit 60, functioning as an example of an image recognition processing section that performs image processing of the image pickup unit 30 and the like in the electronic component mounting apparatus 10, is composed of, as one example, a main machine controller 61 that also performs control of other mechanism units, a sequence controller 62, a man-machine interface 63, and a bus 64 for connecting these members. Conforming to instructions from the sequence controller 62, an interface unit 66 of a camera control unit 65 reads image pickup conditions information (for example, image pickup conditions information inputted by an input-output unit 69 of a computer and the like and stored) stored in advance in a memory unit 67 corresponding to a kind of an electronic component subjected to posture recognition, outputs various instructions or signals from a camera control signal generator 66*c*, and performs predetermined operations for optimum image processing. The interface unit 66 functions as an example of the control section. Input of the image pickup conditions information is executed by reading the image pickup conditions information produced and recorded in advance from a storage medium such as a CD-ROM with the input-output unit 69, or the image pickup conditions information may be inputted through the input-output unit 69 of a computer and the like by communication and then stored in the memory unit 67 in advance. Also, in addition to storing in advance before starting a mounting operation of the component mounting apparatus, appropriate modifications and updates corresponding to mounting operation contents during the mounting operation of the component mounting apparatus is acceptable.

The interface unit 66 makes reference to information on image pickup conditions read from the memory unit 67, and instructs camera control signal generator 66*c*. The camera control signal generator 66*c* selects the first camera 31 or the second camera 32 via a camera control signal output selecting section 66*d* in response to kind (such as size) of an electronic component subjected to posture recognition, and gives illumination control instructions to, for example, the illumination unit 38 to execute illumination conforming to the image pickup conditions from the memory unit 67 so as to decrease difference in lightness between image pickup by the first and second cameras 31 and 32. For example, in order to select a camera having optimum resolution for a size of a component, or spacing of electrodes or leads thereof, the second camera 32 having higher resolution is selected if the component is a component requiring high precision placement including a lead component having lead spacing with small pitches, or a C4 (Controlled Collapse Chip Connection) component such as a BGA (Ball Grid Array) or CSP (Chip Sized Package), while the first camera 31 having lower resolution is selected if the component is a chip component. In a case of a component such as a QFP (Quad Flat Package) or BGA whose leads or electrodes are in mirror states, illumination light is emitted from almost directly beneath by the LED 36 for example. This is because inclined illumination causes diffused reflection of the electrodes, thereby hindering recognition. For other normal components, illumination from an inclined angle of 45 degrees is preferable.

Also, depending on given image pickup conditions, the camera control signal generator 66c controls exposure times of the first and second cameras 31 and 32 so as to decrease difference in lightness of image pickup due to a kind of a component subjected to posture recognition and difference between the first and second cameras 31 and 32. For example, if electrodes of a component subjected to posture recognition are difficult to shine, as is a case of a plated electrode, more particularly difficult in reflecting light, exposure times of the first and second cameras 31 and 32 are prolonged. Alternately, the camera control signal generator 66c controls gain and dynamic range of an A/D converter 67f to control so as to decrease difference in lightness of image pickup due to the kind of the component subjected to posture recognition or a difference between the first and second cameras 31 and 32. Further, the camera control signal generator 66c uses an output of, for example, a 12-MHz oscillator 66a as a readout clock if the first camera 31 is selected while using an output of, for example, a 20-MHz oscillator 66b as a readout clock if the second camera 32 is selected, for executing switch control so as to eliminate a difference in output readout time between the cameras 31 and 32. More particularly, if the second camera 32 is selected, readout clock frequency of the second camera 32 is adjusted to be higher than readout clock frequency of the first camera 31, for eliminating image readout delay in using the second camera 32 in comparison with usage of the first camera 31, thereby enabling elimination of tact (process) delay.

This enables maintenance of high-speed tact. Since image pickup of the circuit board 18 is necessary when the electronic component 13 is moved to the placement position, the camera control signal generator 66c controls to make a board image pickup camera 39 pick up an image of the circuit board 18, for performing placement of the electronic component 13 on the circuit board 18.

Next, description will be given of operation, in the recognition position, of selecting either one of the first and second cameras 31 and 32 according to image pickup conditions read from the memory unit 67 by the interface unit 66 of the camera control unit 65 included in the control section 66 of the image pickup unit 30, and then recognizing a posture of the electronic component 13 sucked by the suction nozzle 12, with reference to FIG. 8.

In this case, in terms of various settings stated above such as setting of the illumination unit 38, setting of exposure times of the first and second cameras 31 and 32, and setting of output gains of the first camera 31 and the second camera 32, it is already determined whether only either any one setting is conducted or setting is made in combination, under a condition of which operation of selecting the first and second cameras 31 and 32, and posture recognition of the electronic component 13 by this selected first or second camera 31 or 32 will be described.

Component data that is component information of a component subjected to placement is inputted from a sequence controller 62 (Step S1). Corresponding to rotation of the index table 11, stoppage in the recognition position is performed (Step 2), and it is decided whether the first camera 31 for small view should be used or the second camera 32 for large view should be used, with reference to a size of the electronic component based on component data inputted in step S1 depending on the component being sucked by the suction nozzle 12 (Step S3).

If, in step S3, the first camera 31 for small components is used, all pixels of an image inputted from the first camera 31 are scanned (Step S4). In step S3, if it is decided that the second camera 32 for large components should be used, it is further decided if this large electronic component 13 subjected to posture recognition belongs to precision components, belongs to middle-size components, or belongs to large-size components among large components (Step S5). It is naturally understood that not only division into three sections but also division into more than three sections are acceptable here.

In step S5, if it is decided that the component belongs to the precision components, a first rough recognition with, for example, "scan spacing 4" is conducted for scanning pixels of an image inputted from the second camera 32 (Step S6). If it is decided that the component belongs to the middle-side components, pixels of an image inputted from the second camera 32 undergoes a second rough recognition with, for example, "scan spacing 8" that is rougher than that of the precision components (Step S7). If it is decided that the component belongs to the large-size components, pixels of an image inputted from the second camera 32 undergoes a third rough recognition with, for example, "scan spacing 10", that is rougher than that of the middle-size components (Step S8). It is noted that the scan spacing 4 refers to a scan performed by every four scanning lines, scan spacing 8 refers to a scan performed by every eight scanning lines, and scan spacing 10 refers to a scan performed by every ten scanning lines.

As a result of each rough recognition depending on kinds of components in steps S6, S7, and S8, a region in a recognized image occupied by an image of the electronic component 13 is roughly clarified. Accordingly, a part unnecessary for posture recognition of the electronic component 13 is removed and posture recognition is performed by precise scan (e.g. full scan) of the electronic component 13 in an appropriate region including a region in which the electronic component 13 exists (Step S9). In performing this precise posture scan, performing posture recognition of the electronic component 13 by limiting a target to a necessary minimum region enables execution of tact in a shorter period of time. When posture recognition is completed, a recognition result is outputted (Step S10) and returned to the main machine controller 61 for use in correction of a position for placing the electronic component 13 in a placement position on the circuit board 18.

Description will be given of one example of a method of shortening time for the image recognition processing section 60 to perform posture recognition of the electronic component 13 when the second camera 32 is selected as described above, with reference to FIG. 9A to FIG. 9D. In a case of scanning 1,000,000 pixels (872 lines×1200) of an image device P (e.g. CCD) of the second camera 32 shown in FIG. 9A, existing regions of large components are recognized as shown in FIG. 9B, FIG. 9C and FIG. 9D by first, second, and third rough recognition according to division of the large components as in steps S6, S7, and S8 shown in FIG. 8.

In a case of FIG. 9B and FIG. 9C, a shaded portion on a lower side is out of a target for pixel read for precise posture recognition. Accordingly, although scan of 872 lines is originally required, scan of 533 lines or 702 lines is sufficient. Further, as a method of shortening time for posture recognition, an upper portion symmetrical to this shaded lower portion may also be out of the target for precise posture recognition. It is also possible to confine the target for read for precise posture recognition to inside of a dotted line shown in FIG. 9B and FIG. 9C.

In FIG. 10, an LED that is an illumination source disposed right under the index table 11 in the recognition position is placed lower than the light diffusing plate 80 and displaced on an upper side of a plane PL on an upper side of an image pickup camera. On a periphery of the LED, there is provided a louver 81 for preventing diffusion of light and concentrating light with use of a condenser lens 83 that is a condensing section, so that the light is reflected upwardly toward the light diffused plate 80 by a mirror 82 disposed on the plane PL and a prism 84. In this case, the camera picks up an image of the electronic component 13 as an outline (shadow outline). In other words, the illumination unit of FIG. 10 is composed of the light diffusing plate 80 disposed opposite to the camera against the component 13 and above the component 13 held by the suction nozzle 12, the LED exemplifying an illumination source for emitting illumination light illuminating the component 13 downwardly, and the mirror 82 exemplifying a reflection section for reflecting the illumination light emitted from the LED upwardly toward the light diffusing plate 80. The illumination light emitted from the LED is reflected by the mirror 82 upwardly toward the light diffused plate 80, the illumination light is diffused by the light diffused plate 80, and an outline image of the component 13 is picked up by the first or second camera 31 or 32 with the diffused light.

In a case where an LED is conventionally disposed on an upper side of plane PL for directly illuminating a light diffusing plate, an angle of reflected light to the plane is approximately 15°. However in this example, when the angle is around 30° or so, the illumination angle is considerably increased as well as quantity of diffused light being increased. This implements good image recognition. Also, this illumination structure makes it possible to make a distance between the light diffusing plate 80 and the image pickup unit identical to a conventional distance.

It will be understood that the present invention is not limited to the embodiment disclosed, but may be embodied in other specific forms. For example, in the illumination unit of FIG. 10, it is possible that use of a high-luminance LED saves the condenser lens 83 and the prism 84, and achieves a specified effect only with the mirror 82. Also, disposing the LED so that light emitted from the LED comes into a lower side of the prism 84 at an angle equal to or larger than a critical angle, and generating total reflection of the light under the prism 84, enables achievement of a specified effect without the mirror 82.

According to the above embodiment, image pickup conditions are adjusted based on component information of the component 13 held by the suction nozzle 12, exemplifying the component holding member, and to be placed on the circuit board 18 exemplifying the circuit forming body, through alternative selection of the first camera 31 exemplifying the first image pickup unit and the second camera 32 exemplifying the second image pickup unit having resolution higher than that of the first camera 31, and through adjustment of image lightness of the component 13 recognized by either one of the cameras. Under the image pickup conditions, the component 13 is illuminated with the LEDs 36, 38 or the LED 37 exemplifying the illumination unit, so that an image of the illuminated electronic component 13 is picked up under the image pickup conditions by either one of the cameras, and component recognition is performed based on this picked-up image. This enables optimum camera selection corresponding to kind of the component 13 and enables adjustment of image lightness of the component 13 recognized by the camera, thereby providing an image with resolution corresponding to the component 13 in a short period of time.

Figure 15:
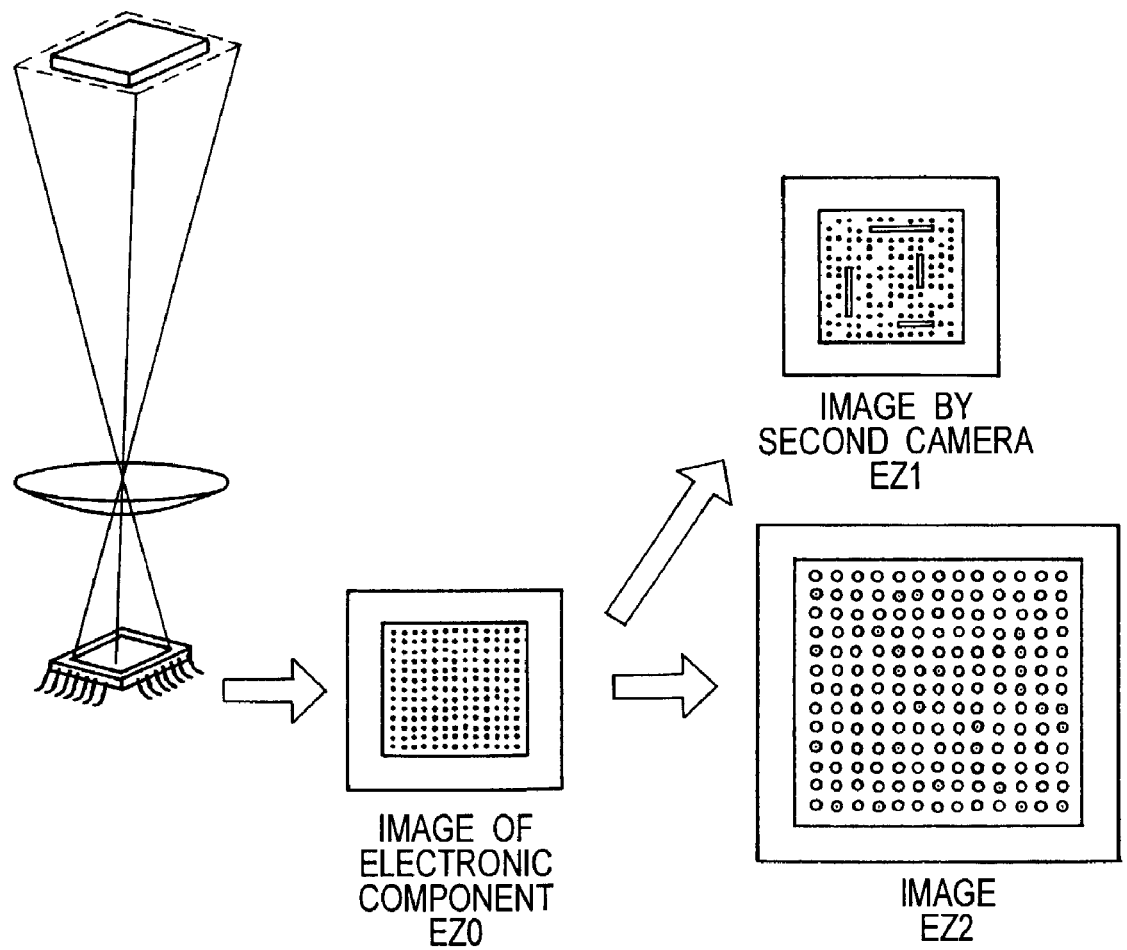
FIG. 15 is a view explaining an image of an electronic component for posture recognition by an image pickup unit.

With an image-reception section of a camera with high resolution having a large number of pixels, a clear image such as an image EZ2 shown in FIG. 15 is obtainable. Consequently, simple usage of two kinds of cameras including a conventional camera with low resolution having a small number of pixels and a camera with high resolution causes an issue that image pickup in uniform quality (seamless image pickup) is not attainable because switchover of the cameras brings about considerable difference in image lightness due to difference in characteristics between these two kinds of cameras. Also, a large number of pixels require longer time for readout, thereby making it difficult to maintain the above-stated tact.

As described above, even if the first camera 31 and the second camera 32 with resolution higher than that of the first camera 31 are disposed in parallel, the control section 66 controls operation so as to eliminate difference in image quality due to difference in performance between the cameras 31 and 32 and a kind of component 13 and, enable seamless selection of the first and second cameras 31 and 32, and implement clear image pickup of large electronic components with resolution necessary for image recognition with use of the second camera 32. Also in the above embodiment, there is provided a structure of having two cameras 31 and 32, which is stronger for vibration than a structure of having at least three cameras.

Also in the above embodiment, when the image pickup conditions are adjusted, illuminance of illumination from the illumination unit to a component may be adjusted or kinds or positions of plural kinds of illumination sources may be selected based on component information of the component.

Thus, changing illuminance of illumination to the electronic component, a kind of the illumination, or a position of the illumination based on information of the electronic component, and selection of the two image pickup units makes it possible to eliminate difference in lightness of an image to be picked up due to difference in performance between both image pickup units and the kind of the electronic component.

Also in the above embodiment, when the image pickup conditions are adjusted, exposure time of an image pickup unit may be adjusted based on the component information.

Thus, changing exposure time of a selected image pickup unit based on information of the electronic component and selection of the image pickup unit, makes it possible to eliminate difference in lightness of an image to be picked up due to difference in performance between the image pickup units and the kind of the electronic component.

Also in the above embodiment, when the image pickup conditions are adjusted, an image signal gain may be adjusted so as to be suited for image recognition based on the component information of the component to eliminate difference in lightness of the image to be picked up due to difference in performance between the first image pickup unit and the second image pickup unit and the kind of the component.

Thus, controlling an image signal gain so as to be suited for image recognition makes it possible to eliminate difference in lightness of an image to be picked up due to difference in performance of both the image pickup units and the kind of the component.

Also in the above embodiment, when the image pickup conditions are adjusted, a readout clock frequency of the second image pickup unit may be adjusted to be higher than a readout clock frequency of the first image pickup unit if the second image pickup unit is selected based on the component information of the component.

Thus, setting the readout clock frequency high only when the second image pickup unit with high resolution (a large number of pixels) is selected eliminates image readout delay in comparison with usage of the first image pickup unit, thereby eliminating tact delay.

Also in the above embodiment, when the image pickup conditions are adjusted, scan spacing of a component image picked up by the image pickup unit is set in accordance with the kind of the image pickup unit and the kind of the component based on the component information of the component, and when component recognition is performed based on the picked-up image, this picked-up component image is scanned based on the scan spacing of the component image set in accordance with the kind of the image pickup unit and the kind of the component, a component existing region in the component image is recognized, and then this recognized component existing region can be recognized as an image so as to enable posture recognition of the component.

Thus, performing image pickup and then performing recognition while culling out an electronic component existing region, and then finally performing image recognition of a recognized electronic component existing region shortens readout time and consequently shortens tact of the electronic component device in its entirety. Also, switching to the second image pickup unit may shorten readout time more effectively, resulting in implementing shortened tact.

Also in the above embodiment, when the component is illuminated with the illumination unit under the image pickup conditions, illumination direction of illumination light emitted to the component can be other than a direction orthogonal to any side of the component.

Figure 16A:
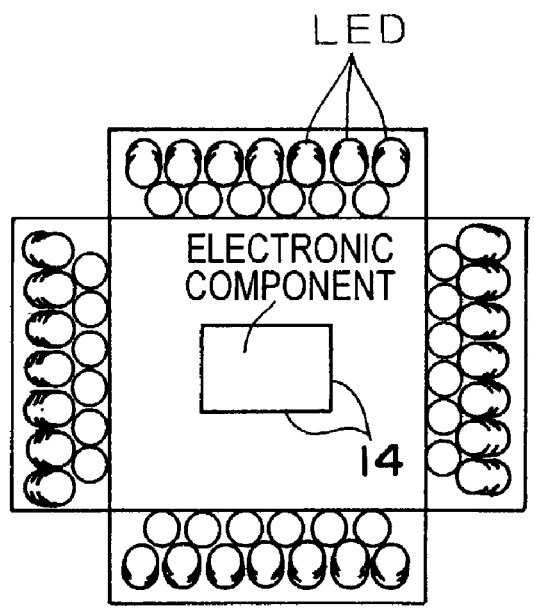
FIG. 16A and FIG. 16B are views each showing conventional illumination direction of illumination to an electronic component.
Figure 16B:
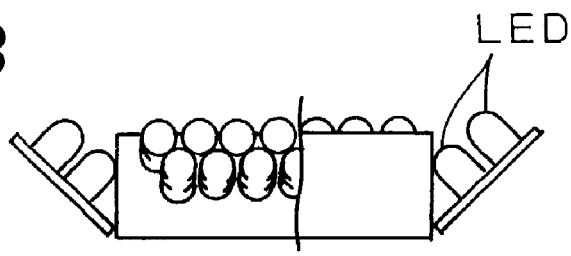

Regarding the above, a conventional illumination method of electronic components has had an issue as shown below. The issue will be described with reference to FIG. 16A and FIG. 16B. FIG. 16A is a plan view showing an electronic component and a position of LED 136 for illuminating the electronic component as seen from a side of suction nozzle 112, and FIG. 16B is a front view thereof.

When illumination light is emitted in a direction orthogonal to each side 14 of the electronic component, the light may be reflected by illuminated side 14 and be picked up as noise in an image during image recognition, thereby causing misrecognition. This occurs particularly when the electronic component is a BGA, CSP, and the like, since pins and balls that are terminals of the component are close to mirrors. These components require image recognition with high precision, which causes an issue.

For such a conventional issue, setting an illumination angel of illumination to an electronic component to other than a direction orthogonal to one side of the electronic component prevents light from being reflected by the one side of the electronic component and being picked up as noise in an image during image recognition, thereby preventing misrecognition. This is particularly effective for image recognition of terminals of the component (pins and balls) with good precision in a case where the component is an electronic component having a large outline (BGA/CSP and the like).

Also in the above embodiment, when the component is illuminated with the illumination unit under the image pickup conditions, illumination light emitted from an illumination source is reflected by a reflection section upwardly toward a light diffusing plate disposed opposite to the image pickup unit with respect to the component, and the illumination light is diffused by the light diffusing plate, and when an image of the illuminated component is picked up by either one of the image pickup units under the image pickup conditions, an outline image of the component may be picked up with light diffused by the light diffusing plate.

Figure 17:
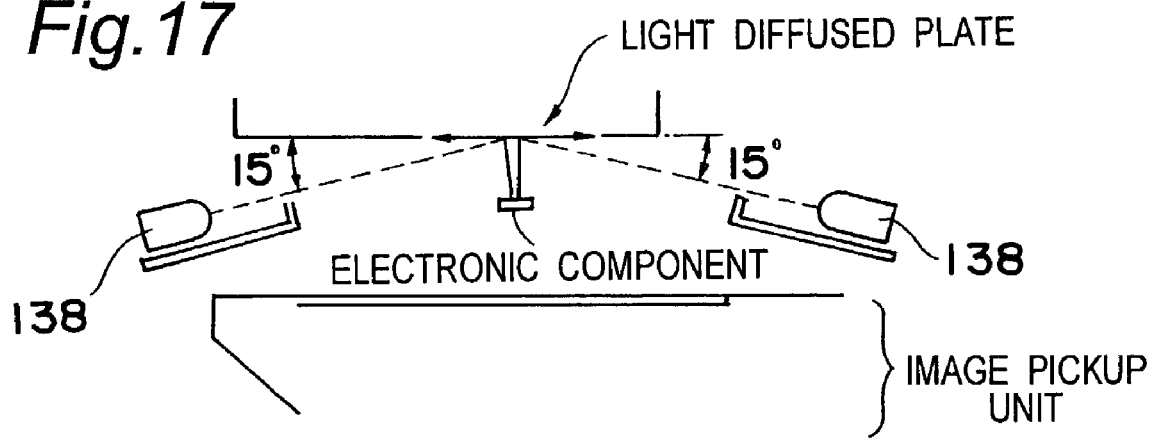
FIG. 17 is a view showing illumination direction of illumination in a case of using a conventional light diffusing plate.

Regarding the above, conventionally there has been an issue as shown below. Accordingly, description will be given of conventional illumination for illuminating a light diffusing plate on an opposite side of an image pickup unit with respect to a sucked electronic component, with reference to FIG. 17. In FIG. 17, an LED 138 has an illumination angle of, for example, 15° relative to a horizontal direction of a light diffusing plate. With light reflected and diffused by the light diffusing plate, an outline image of an electronic component is picked up by the image pickup unit for image recognition. In this case, since the illumination angle is small and therefore quantity of light diffused by the light diffusing plate is small, a larger quantity of light is desired for obtaining a clearer outline image of the electronic component with use of the image pickup unit.

Therefore, in order to improve illumination efficiency for obtaining an outline image of the electronic component, it is desirable to emit illumination light to the light diffusing plate at an angle as large as possible relative to the horizontal direction of the light diffusing plate. However, there is an issue that due to structure of a component mounting apparatus, a distance from the image pickup unit to the light diffusing plate cannot be increased.

For such a conventional issue, according to the above embodiment, in a case where illumination is emitted to the light diffusing plate for recognizing an outline of the electronic component with the image pickup unit, illumination light may be emitted to the light diffusing plate at a large angle relative to the horizontal direction of the light diffusing plate without changing a distance from the image pickup unit to the light diffusing plate, more particularly without increasing a distance from the image pickup unit to the light diffusing plate, which increases quantity of diffused light in the light diffusing plate, and improves illumination efficiency for obtaining an outline image of the electronic component, thereby implementing good image recognition.

Also in the above embodiment, when the image pickup conditions are adjusted, the second image pickup unit can be selected if, in component information of a component, the component is a lead component, or a C4 component such as a BAG or CSP, while the first image pickup unit can be selected if the component is a chip component.

Thus, an image pickup unit having optimum resolution for a component may be selected, which enables image pickup of small components to large components with almost the same image pickup quality while maintaining good resolution for image recognition.

Also in the above embodiment, when the image pickup conditions are adjusted, exposure time may be prolonged if, in component information of a component, electrode(s) of the component has difficulty in reflecting light like a plating electrode.

Thus, optimum exposure time may be set for the component, which enables image pickup of small components to large components with almost the same image pickup quality while maintaining good resolution for image recognition.

Also in the above embodiment, when image pickup conditions are adjusted, illumination light from an illumination source may be controlled so as to be emitted from almost right under a component if electrode(s) of the component is in a mirror state.

Thus, optimum illumination light for the component may be selected, which enables image pickup of small components to large components with almost the same image pickup quality while maintaining good resolution for image recognition.

It is noted that appropriate combinations of arbitrary embodiments among various embodiments stated above make it possible to implement an effect of each embodiment.

According to the present invention, even if the first image pickup unit and the second image pickup unit with high resolution are placed in parallel, the control section controls so as to eliminate difference in image quality due to difference in performance between the both image pickup units and kind of electronic component, enable seamless selection of the first and second image pickup units, and implement clear image pickup of large electronic components with resolution necessary for image recognition with use of the second image pickup unit.

Also, changing illuminance of illumination, kind of illumination, or a position of illumination to an electronic component based on information of the electronic component and through selection of two image pickup units makes it possible to eliminate difference in lightness of an image to be picked up due to difference in performance between both image pickup units and kind of the electronic component.

Also, changing exposure time of an image pickup unit selected by the control section based on information of the electronic component and through selection of the image pickup unit makes it possible to eliminate difference in lightness of the image to be picked up due to difference in performance between the image pickup units and the kind of the electronic component.

Also, controlling an image signal gain so as to be suited for image recognition makes it possible to eliminate difference in lightness of the image to be picked up due to difference in performance of both image pickup units and the kind of the component.

Also, setting a readout clock frequency high when the second image pickup unit with high resolution (a large number of pixels) is selected eliminates image readout delay in comparison with usage of the first image pickup unit, thereby eliminating tact delay.

Also, performing image pickup and performing recognition while culling out an electronic component existing region, and then finally performing image recognition of a recognized electronic component existing region shortens readout time and consequently shortens tact of the electronic component device in its entirety. Also, switching to the second image pickup unit can shorten readout time more effectively, resulting in implementing shortened tact.

Further, setting an illumination angle of illumination to an electronic component to other than a direction orthogonal to one side of the electronic component prevents light from being reflected by the one side of the electronic component and being picked up as noise in an image during image recognition, thereby preventing misrecognition. This is particularly effective for image recognition of terminals of the component (pins and balls) with good precision in a case where the component is an electronic component having a large outline (BGA/CSP and the like).

Furthermore, in a case where illumination is emitted to the light diffusing plate for recognizing an outline of the electronic component with the image pickup unit, illumination light may be emitted to the light diffusing plate at a large angle relative to a horizontal direction of the light diffusing plate without changing a distance from the image pickup unit to the light diffusing plate, which increases quantity of diffused light in the light diffusing plate, and improves illumination efficiency for obtaining an outline image of the electronic component, thereby implementing good image recognition.

According to the above, there are implemented optimum camera selection corresponding to a kind of a component and setting of scan spacing, which can provide an image with resolution corresponding to the component in a short period of time.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The invention claimed is:

1. A component recognition device for recognizing and processing a picked-up image of a component, comprising:
   an illumination unit for emitting illumination light to a component when held by a component holding member and to be placed on a circuit forming body;
   a first image pickup unit for recognizing a component, when held by the component holding member and illuminated by said illumination unit, with a first resolution;
   a second image pickup unit for recognizing a component, when held by the component holding member and illuminated by said illumination unit, with a second resolution that is higher than the first resolution; and
   a control section for
   (i) based on component information of a component to be recognized, adjusting image pickup conditions by
      (a) alternatively selecting one of said first image pickup unit and said second image pickup unit,
      (b) adjusting a condition related to image lightness of the component to be recognized, and
      (c) when said second image pickup unit is selected by said control section, adjusting a readout clock frequency of said second image pickup unit to be higher than a readout clock frequency of said first image pickup unit, and
   (ii) performing control such that an image of the component to be recognized is picked up, under the image pickup conditions as adjusted by said control section, by the one of said first and second image pickup units as selected by said control section.

2. The component recognition device according to claim 1, wherein
   said illumination unit includes plural kinds of illumination sources capable of illuminating a component with different kinds of illumination light and being disposed in different positions relative to the component when held by the component holding member, and
   said control section is for adjusting the condition related to image lightness of the component to be recognized by (i) adjusting illuminance of illumination from said illumination unit to the component to be recognized when held by the component holding member, or (ii) selecting a kind or a position of said plural kinds of illumination sources.

3. The component recognition device according to claim 2, wherein
said plural kinds of illumination sources include
(i) a first illumination source disposed so as to be able to emit illumination light for illuminating a component, when held by the component holding member, from almost directly beneath the component, and
(ii) a second illumination source disposed so as to be able to emit illumination light for illuminating the component, when held by the component holding member, from an inclined lower side of the component, and
said control section is for adjusting the condition related to image lightness of the component to be recognized by causing illumination light to be emitted from said first illumination source if an electrode of the component to be recognized is in a mirror state.

4. The component recognition device according to claim 1, wherein
said control section is for adjusting the condition related to image lightness of the component to be recognized by adjusting an exposure time of the one of said first and second image pickup units as selected by said control section.

5. The component recognition device according to claim 4, wherein
said control section is for adjusting the condition related to image lightness of the component to be recognized by prolonging an exposure time if, based on the component information, an electrode of the component to be recognized has difficulty in reflecting light.

6. The component recognition device according to claim 1, wherein
said control section is for adjusting the condition related to image brightness of the component to be recognized by adjusting an image signal gain, so as to be suited for image recognition, to eliminate difference in lightness of an image of the component to be recognized that is to be picked up by the one of said first and second image pickup units as selected by said control section, due to difference in performance between said first image pickup unit and said second image pickup unit, and a kind of the component to be recognized.

7. The component recognition device according to claim 1, wherein
said control section is also for, based on the component information of the component to be recognized, adjusting the image pickup conditions by setting a scan spacing of the image of the component to be recognized that is to be picked up by the one of said first and second image pickup units as selected by said control section, in accordance with the one of said first and second image pickup units and a kind of the component to be recognized,
said component recognition device further comprising:
an image recognition processing section for
(i) scanning the image, as picked up by the one of said first and second image pickup units, based on the scan spacing as set by said control section,
(ii) recognizing a component existing region in the image, and then
(iii) recognizing the component existing region, as recognized by said image processing section, as an image so as to enable posture recognition of the component.

8. The component recognition device according to claim 1, wherein
said illumination unit includes an illumination source for emitting illumination light for illuminating a component, when held by the component holder, from an illumination direction that is other than a direction orthogonal to any side of the component when held by the component holding member.

9. The component recognition device according to claim 1, wherein
said illumination unit includes
(i) light diffusing plate disposed opposite to said first and second image pickup units relative to a component when held by the component holding member, and above the component when held by the component holding member,
(ii) an illumination source for emitting illumination light for illuminating the component, when held by the component holding member, downwardly, and
(iii) a reflection section for reflecting the illumination light emitted from said illumination source upwardly toward said light diffusing plate,
such that when the illumination light is emitted from the illumination source and reflected by said reflection section upwardly toward said light diffusing plate, the illumination light is diffused by said light diffusing plate and an outline image of the component is picked up, as the image of the component to be recognized, by the one of said first and second image pickup units, upon said control section performing said control via this diffused light.

10. The component recognition device according to claim 1, wherein
said control section is for alternatively selecting one of said first image pickup unit and said second image pickup unit by
(i) selecting said second image pickup unit if, based on the component information, the component to be recognized is a lead component, or a C4 component of a BAG or a CSP, and
(ii) selecting said first image pickup unit if, based on the component information, the component to be recognized is a chip component.

11. A component mounting apparatus comprising:
the component recognition device as defined in claim 1; and
the component holding member, said component holding member for holding the component at a component holding position and moving the component along a moving route to a placement position of the circuit forming body through a recognition position,
wherein the component mounting apparatus is for illuminating the component, when held by said component holding member, with said illumination unit of said component recognition device at the recognition position on the moving route to perform recognition processing of the image of the component picked up by the one of said first and second image pickup units, and for correcting a posture of said component holding member relative to the placement position based on a result of the recognition processing.

12. A component recognition method comprising:
based on component information of a component held by a component holding member and to be placed on a circuit forming body, adjusting image pickup conditions by
(a) alternatively selecting one of a first image pickup unit and a second image pickup unit, with said second image pickup unit having a resolution higher than a resolution of said first image pickup unit, and
(b) adjusting a condition related to image lightness of said component;
under the image pickup conditions as adjusted,
(i) using an illumination unit to illuminate said component, and
(ii) picking up an image of said component, when illuminated, by the one of said first and second image pickup units as selected; and
performing component recognition based on the image of said component as picked-up,
wherein, when said second image pickup unit is selected, adjusting said image pickup conditions includes adjusting a readout clock frequency of said second image pickup unit to be higher than a readout clock frequency of said first image pickup unit.

13. The component recognition method according to claim 12, wherein
adjusting said condition related to image lightness of said component, comprises
(i) adjusting an illuminance of illumination emitted from said illumination unit to said component, or
(ii) selecting kinds or positions of plural kinds of illumination sources of said illumination unit.

14. The component recognition method according to claim 12, wherein
adjusting said condition related to image lightness comprises emitting illumination light from almost directly beneath said component if an electrode of said component is in a mirror state.

15. The component recognition method according to claim 12, wherein
adjusting said condition related to image lightness of said component comprises adjusting an exposure time of the one of said first and second image pickup units as selected.

16. The component recognition method according to claim 15, wherein
adjusting said condition related to image lightness comprises prolonging an exposure time if, based on the component information, an electrode of said component has difficulty in reflecting light.

17. The component recognition method according to claim 12, wherein
using an illumination unit to illuminate said component comprises
(i) reflecting upwardly illumination light, emitted from an illumination source, by a reflection section toward a light diffusing plate disposes opposite to said first and second image pickup units relative to said component, and
(ii) diffusing said illumination by said light diffusing plate,
such that picking up said image of said component comprises picking up an outline image of said component with light diffused by said light diffusing plate.

18. The component recognition method according to claim 12, wherein
alternatively selecting one of a first image pickup unit and a second image pickup unit comprises
(i) selecting said second image pickup unit if, based on the component information, said component is a lead component, or a C4 component of a BAG or a CSP, and
(ii) selecting said first image pickup unit if, based on the component information, said component is a chip component.

19. The component recognition method according to claim 12, wherein
adjusting said condition related to image lightness of said component comprises adjusting an image signal gain, so as to be suited for image recognition, to eliminate difference in lightness of an image of said component that is to be picked by the one of said first and second image pickup units as selected, due to difference in performance between said first image pickup unit and said second image pickup unit, and a kind of said component.

20. The component recognition method according to claim 12, further comprising:
based on the component information of said component, setting a scan spacing of the image of said component that is to be picked up by the one of said first and second image pickup units, as selected, in accordance with the one of said first and second image pickup units and a kind of said component;
scanning the image, as picked up by the one of said first and second image pickup units, based on said scan spacing as set;
recognizing a component existing region in said image; and then
recognizing said component existing region, as recognized, as an image so as to enable posture recognition of said component.

21. The component recognition method according to claim 12, wherein
using an illumination unit to illuminate said component comprises emitting illumination light to said component from a direction that is other than a direction orthogonal to any side of said component.

22. A component mounting method comprising:
using a component holding member to hold a component at a component holding position and move said component along a moving route to a placement position of a circuit forming body through a recognition position;
at said recognition position, performing component recognition in accordance with the component recognition method as defined in claim 12; then
correcting a posture of said component holding member relative to said placement position based on a result of said component recognition; and
placing said component, held by said component holding member, onto said placement position of said circuit forming body.

* * * * *